United States Patent
Hatakeyama et al.

(10) Patent No.: US 7,455,952 B2
(45) Date of Patent: Nov. 25, 2008

(54) PATTERNING PROCESS AND RESIST OVERCOAT MATERIAL

(75) Inventors: Jun Hatakeyama, Joetsu (JP); Yuji Harada, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 379 days.

(21) Appl. No.: 11/105,510

(22) Filed: Apr. 14, 2005

(65) Prior Publication Data
US 2005/0233254 A1    Oct. 20, 2005

(30) Foreign Application Priority Data

| Apr. 16, 2004 | (JP) | ................... 2004-121506 |
| Aug. 24, 2004 | (JP) | ................... 2004-244030 |
| Oct. 20, 2004 | (JP) | ................... 2004-305183 |

(51) Int. Cl.
G03F 7/00 (2006.01)
G03F 7/004 (2006.01)
C08F 2/00 (2006.01)
C08F 12/30 (2006.01)

(52) U.S. Cl. ............... 430/273.1; 430/270.1; 526/72; 526/286; 526/287; 526/319; 526/320; 526/321

(58) Field of Classification Search ............. 430/270.1, 430/273.1, 281.1, 286.1; 526/72, 286, 287, 526/319, 320, 321
See application file for complete search history.

(56) References Cited

U.S. PATENT DOCUMENTS

| 5,861,232 A * | 1/1999 | Kanda et al. ............ 430/281.1 |
| 6,107,006 A | 8/2000 | Chang et al. |
| 6,136,505 A | 10/2000 | Tanabe et al. |
| 6,788,477 B2 * | 9/2004 | Lin ........................... 359/820 |
| 6,943,271 B2 * | 9/2005 | Sumida et al. ............. 568/659 |
| 7,105,618 B2 * | 9/2006 | Komoriya et al. ........... 526/242 |
| 7,122,293 B2 * | 10/2006 | Sugasaki et al. ......... 430/273.1 |
| 2003/0152864 A1 * | 8/2003 | Araki et al. ............. 430/270.1 |
| 2004/0236046 A1 * | 11/2004 | Miyazawa et al. .......... 526/245 |
| 2005/0147920 A1 * | 7/2005 | Lin et al. .................... 430/311 |
| 2005/0161644 A1 * | 7/2005 | Zhang et al. ................ 252/582 |
| 2005/0202351 A1 * | 9/2005 | Houlihan et al. ........... 430/322 |
| 2005/0250898 A1 * | 11/2005 | Maeda et al. ............... 524/544 |
| 2006/0036005 A1 * | 2/2006 | Kanda et al. .................. 524/55 |

(Continued)

FOREIGN PATENT DOCUMENTS

EP          0 521 296 A1    1/1993

(Continued)

OTHER PUBLICATIONS

Sato M: "Tok Resist & Material Development status for Immersion Lithography", Jan. 28, 2004.

(Continued)

*Primary Examiner*—Amanda C. Walke
(74) *Attorney, Agent, or Firm*—Birch, Stewart, Kolasch & Birch, LLP

(57) ABSTRACT

In an immersion lithography process, a pattern is formed by forming a photoresist layer on a wafer, forming a protective coating on the photoresist layer from a resist overcoat material, exposing the layer structure to light in water, and developing. A water-insoluble, alkali-soluble material is used as the resist overcoat material.

16 Claims, 5 Drawing Sheets

U.S. PATENT DOCUMENTS

2006/0188804 A1 * 8/2006 Allen et al. ............... 430/270.1

FOREIGN PATENT DOCUMENTS

| | | | |
|---|---|---|---|
| EP | 1176467 A1 * | 1/2002 | |
| EP | 1 596 251 A1 | 11/2005 | |
| EP | 1 610 178 A1 | 12/2005 | |
| JP | 60-38821 A | 2/1985 | |
| JP | 62-62520 A | 3/1987 | |
| JP | 62-62521 A | 3/1987 | |
| JP | 5-74700 A | 3/1993 | |
| JP | 6-273926 A | 9/1994 | |
| JP | 6-289620 A | 10/1994 | |
| JP | 7-160002 A | 6/1995 | |
| JP | 7-181684 A | 7/1995 | |
| JP | 7-234514 A | 9/1995 | |
| JP | 7-295210 A | 11/1995 | |
| JP | 7-333855 A | 12/1995 | |
| JP | 8-44066 A | 2/1996 | |
| JP | 8-95253 A | 4/1996 | |
| JP | 8-179509 A | 7/1996 | |
| JP | 8-292562 A | 11/1996 | |
| JP | 8-320569 A | 12/1996 | |
| JP | 9-50129 A | 2/1997 | |
| JP | 9-90615 A | 4/1997 | |
| JP | 9-236915 A | 9/1997 | |
| JP | 9-258452 A | 10/1997 | |
| JP | 9-258453 A | 10/1997 | |
| JP | 9-291228 A | 11/1997 | |
| JP | 9-325500 A | 12/1997 | |
| JP | 10-3001 A | 1/1998 | |
| JP | 10-17623 A | 1/1998 | |
| JP | 10-69091 A | 3/1998 | |
| JP | 2803549 B2 | 7/1998 | |
| JP | 11-124531 A | 5/1999 | |
| JP | 2001-133984 A | 5/2001 | |
| JP | 2001-194798 A | 7/2001 | |
| JP | 2002040652 A * | 2/2002 | |
| WO | WO-95/10798 A1 | 4/1995 | |
| WO | WO 02/066526 A1 * | 8/2002 | |
| WO | WO-03/077034 A2 | 9/2003 | |
| WO | WO-2005/088397 A2 | 9/2005 | |

OTHER PUBLICATIONS

Raub et al., Journal of Vacuum Science and Technology B, vol. 22, No. 6, pp. 3459-3464, Nov./ Dec. 2004.

Lin, "Semiconductor foundry, lithography, and partners", Proc. SPIE vol. 4690, pp. xxix-xlii, 2002.

Owa et al., "Immersion lithography; its potential performance and issues", Proc. SPIE vol. 5040, pp. 724-733, 2003.

Hirayama, "Resist and cover material investigation for immersion lithography", 2nd Immersion Workshop, Jul. 11, 2003.

* cited by examiner

IMMERSION TARC n1.3

IMMERSION TARC n1.4

IMMERSION TARC n1.45

IMMERSION TARC n1.5

IMMERSION TARC n1.55

IMMERSION TARC n1.6

IMMERSION TARC n1.65

IMMERSION TARC n1.7

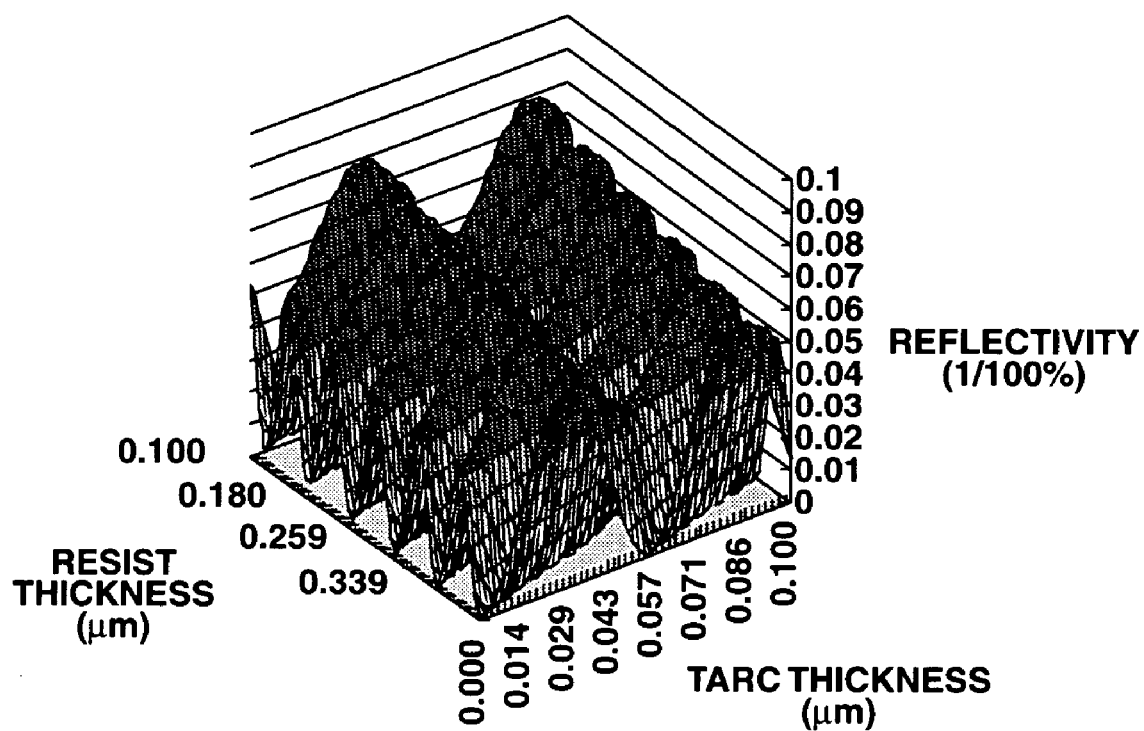

PATTERNING PROCESS AND RESIST OVERCOAT MATERIAL

CROSS-REFERENCE TO RELATED APPLICATION

This non-provisional application claims priority under 35 U.S.C. §119(a) on Patent Application Nos. 2004-121506, 2004-244030 and 2004-305183 filed in Japan on Apr. 16, 2004, Aug. 24, 2004 and Oct. 20, 2004, respectively, the entire contents of which are hereby incorporated by reference.

TECHNICAL FIELD

This invention generally relates to an immersion lithography process involving directing radiation having a wavelength of 180 to 250 nm, especially ArF excimer laser radiation having a wavelength of 193 nm from a projection lens toward a wafer, with water intervening between the lens and the wafer. More particularly, it relates to a resist overcoat material used as a photoresist protective coating in the immersion lithography and a process for forming a resist pattern using the same.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source.

As the light source used in the lithography for resist pattern formation, g-line (436 nm) or i-line (365 nm) from a mercury lamp was widely used. One means believed effective for further reducing the feature size is to reduce the wavelength of exposure light. For the mass production process of 64 M-bit dynamic random access memory (DRAM, processing feature size 0.25 µm or less), the exposure light source of i-line (365 nm) was replaced by a KrF excimer laser having a shorter wavelength of 248 nm. However, for the fabrication of DRAM with a degree of integration of 256 M and 1 G or more requiring a finer patterning technology (processing feature size 0.2 µm or less), a shorter wavelength light source is required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE Vol. 5040, p 724).

Several problems associated with the presence of water on resist were pointed out. For example, profile changes occur because the acid once generated from a photoacid generator and the amine compound added to the resist as a quencher can be dissolved in water. The pattern collapses due to swelling. It was then proposed to provide a protective coating between the resist and water (see the 2nd Immersion Workshop, Jul. 11, 2003, Resist and Cover Material Investigation for Immersion Lithography).

In the lithography history, the protective coating on the resist layer was studied as an antireflective coating. For example, the antireflective coating on resist (ARCOR) process is disclosed in JP-A 62-62520, JP-A 62-62521, and JP-A 60-38821. The ARCOR process involves forming a transparent antireflective coating on top of a resist film and stripping it after exposure. Despite its simplicity, the process can form a micropattern at a high degree of definition, precision and alignment. When the antireflective coating is made of perfluoroalkyl compounds (e.g., perfluoroalkyl polyethers or perfluoroalkyl amines) having a low refractive index, the light reflection at the resist/antireflective coating interface is minimized so that the dimensional precision is improved. In addition to these materials, the fluorinated materials proposed thus far include amorphous polymers such as perfluoro(2,2-dimethyl-1,3-dioxol)-tetrafluoroethylene copolymers and cyclic polymers of perfluoro(allyl vinyl ether) and perfluorobutenyl vinyl ether as disclosed in JP-A 5-74700.

Because of their low compatibility with organic substances, the foregoing perfluoroalkyl compounds must be diluted with fluorocarbon solvents such as Freon for controlling a coating thickness. As is well known in the art, the use of fluorocarbons now raises an issue from the standpoint of environmental protection. The perfluoroalkyl compounds are awkward to form uniform films, and are not regarded satisfactory as antireflective films. Additionally, the antireflective films must be stripped with fluorocarbon solvents prior to the development of photoresist. These factors lead to many practical disadvantages including a need to add an antireflective film-stripping unit to the existing system and the increased cost of fluorocarbon solvents.

If the antireflective film is to be stripped without adding an extra unit to the existing system, it is most desirable to carry out stripping in the development unit. The solutions used in the photoresist development unit are an alkaline aqueous solution as the developer and deionized water as the rinse. It would be desirable to have an antireflective coating material which can be readily stripped with such solutions.

For this reason, there were proposed a number of water-soluble antireflective coating materia processes using the same. See, for example, JP-A 6-273926, JP-A 6-289620, and JP-A 7-160002.

The water-soluble protective coatings, however, cannot be used in the immersion lithography because they are dissolved away in water during light exposure. On the other hand, water-insoluble fluoro-polymers pose a need for special fluorocarbon strippers and an exclusive stripping cup for fluorocarbon solvents. It was thus desired to have a resist protective coating which is water insoluble, but can be readily stripped.

The ideal refractive index of an antireflective coating on resist is a square root of the refractive index of air multiplied by the refractive index of the resist film. Since ArF resist films based on methacrylate and cycloolefin polymers have a refractive index of approximately 1.72 at 193 nm, for lithography in air, the optimum refractive index of the overcoat film is a square root of 1.72, which is calculated to be 1.31. For immersion lithography wherein the immersion medium is water, for example, the optimum is a square root of the refractive index 1.44 of water multiplied by the refractive index 1.72 of the resist film, which is calculated to be 1.57.

Fluoro-polymers, which are reported in the 2nd Immersion Workshop, Jul. 11, 2003, Resist and Cover Material Investigation for Immersion Lithography, have a low refractive index of 1.38 which is far off the optimum value.

The inventors performed a simulation of immersion lithography at wavelength 193 nm, with the results shown in FIGS. 1 to 9. Assume a layer structure including, in sequence, a Si substrate, an antireflective coating (BARC) having a refractive index (n) 1.5, an extinction coefficient (k) 0.4, and a thickness 85 nm, a resist layer having a refractive index 1.72, and a resist protective coating (or top anti-reflective coating, TARC). When the refractive index and thickness of TARC and the thickness of the resist layer were varied, the reflectivity from TARC to water was computed. The reflectivity varies periodically as the thickness of TARC and the thickness of resist vary. The thickness of TARC (pointed by the arrow) when the reflectivity of resist becomes minimum is the optimum TARC thickness. The target value of reflectivity is set at 2% or less (reflectivity$\leq$0.02). Where the refractive index of TARC (=1.3, 1.4) is lower than that of water, the reflectivity exceeds 4%. A reflectivity of 2% or less is obtained when the refractive index of TARC is 1.55, 1.60 and 1.65. It is thus seen that a refractive index of approximately 1.57 is the optimum.

SUMMARY OF THE INVENTION

An object of the invention is to provide a resist overcoat material for use in immersion lithography which is so process amenable that it performs well in immersion lithography and can be removed at the same time as the photoresist layer during development; and a process for forming a pattern using the same.

The inventors have discovered that a material which is insoluble in water, dissolvable in alkaline aqueous solution, and immiscible with the photoresist layer is amenable to immersion lithography over a wider range in that when it is used as a resist protective coating, the coating can be simultaneously stripped during development with alkaline aqueous solution.

Therefore, the present invention provides a patterning process and a resist overcoat material as defined below.

In a first aspect, the invention provides an immersion lithography process for forming a pattern, comprising the steps of forming a photoresist layer on a wafer, forming a protective coating on the photoresist layer from a resist overcoat material, exposing the layer structure to light in water, and developing, the resist overcoat material being a water-insoluble, alkali-soluble material.

Preferably, the exposing step includes directing radiation having a wavelength in the range of 180 to 250 nm from a projection lens toward the wafer, with water intervening between the projection lens and the wafer. Also preferably, the developing step includes developing the photoresist layer and stripping the protective coating of resist overcoat material at the same time, using an alkaline developer.

In a preferred embodiment, the resist overcoat material comprises a polymer having copolymerized recurring units containing fluorine and recurring units having alkali-soluble hydrophilic groups. The polymer is typically used as a solution in a solvent which does not dissolve the photoresist layer. The solvent is preferably an alkyl alcohol or fluorinated alkyl alcohol.

In a second aspect, the invention provides a resist overcoat material for use in the immersion lithography process, comprising as a film-forming component a polymer having copolymerized recurring units containing fluorine and recurring units having sulfo or carboxyl groups.

Preferably, the recurring units containing fluorine are recurring units selected from the following general formulae (1) and (2), and the recurring units having sulfo or carboxyl groups are recurring units selected from the following general formulae (3) to (7).

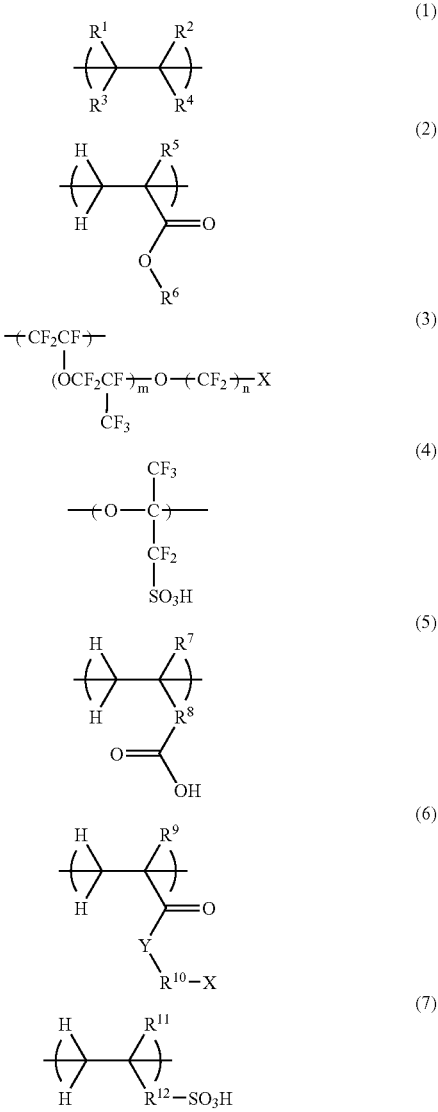

Herein $R^1$ to $R^4$ are independently selected from the class consisting of hydrogen atoms, fluorine atoms, $C_1$-$C_{10}$ alkyl groups, at least partially fluorine-substituted $C_1$-$C_{10}$ alkyl groups, and at least partially fluorine-substituted $C_1$-$C_{10}$ alkyl ether groups, which may have hydroxyl groups, or $R^3$ and $R^4$ may bond together to form a ring with the carbon atoms to which they are attached, either one of $R^1$ to $R^4$ should contain at least one fluorine atom; $R^5$ is hydrogen, fluorine, methyl, trifluoromethyl or —CH$_2$C(=O)OH; $R^6$ is a straight, branched or cyclic C$_1$-C$_{20}$ alkyl group which may have an ester, ether, hydroxy or amide group and which should contain at least one fluorine atom; $R^7$ is hydrogen, fluorine, methyl or trifluoromethyl; $R^8$ is a single bond or a straight, branched or cyclic C$_1$-C$_4$ alkylene group which may have an ether group; $R^9$ and $R^{11}$ each are hydrogen or methyl; $R^{10}$ is a C$_1$-C$_{10}$ alkylene group; $R^{12}$ is a single bond or a straight, branched or cyclic C$_1$-C$_4$ alkylene group; X is a carboxyl or sulfo group; Y is —O— or —NH—; m is an integer of 0 to 10; and n is an integer of 1 to 10.

Typically, the resist overcoat material further comprises a solvent selected from higher alcohols, nonpolar solvents and fluorinated solvents, the polymer being dissolved in the solvent. The solvent is preferably an alkyl alcohol or fluorinated alkyl alcohol.

The patterning process of the invention enables satisfactory immersion lithography, forms a rectangular profile pattern through exposure to radiation of 180 to 250 nm wavelength, typically ArF excimer laser light, and at a high sensitivity, permits a protective coating of a resist overcoat material to be stripped at the same time as the resist during alkaline development, and thus offers a simpler process.

BRIEF DESCRIPTION OF THE DRAWINGS

FIG. 9 is a graph of simulated reflectivity for TARC having a refractive index of 1.8.

DESCRIPTION OF THE PREFERRED EMBODIMENTS

Figure 1:
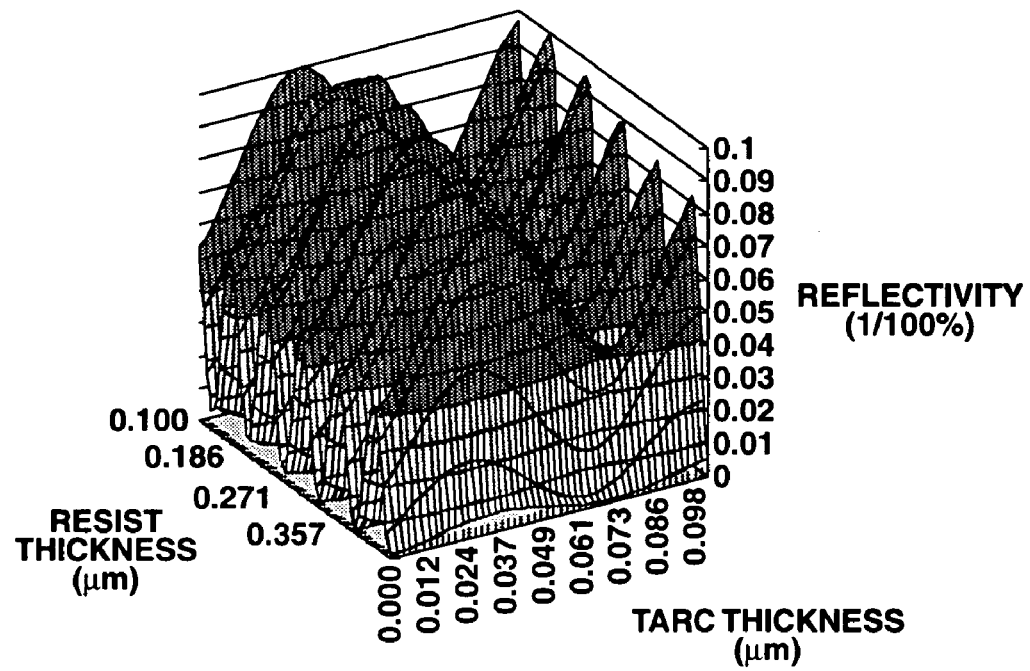
FIG. 1 is a graph of simulated reflectivity for a resist overlay protective coating (TARC) having a refractive index of 1.3 as a function of resist thickness and TARC thickness.
Figure 2:
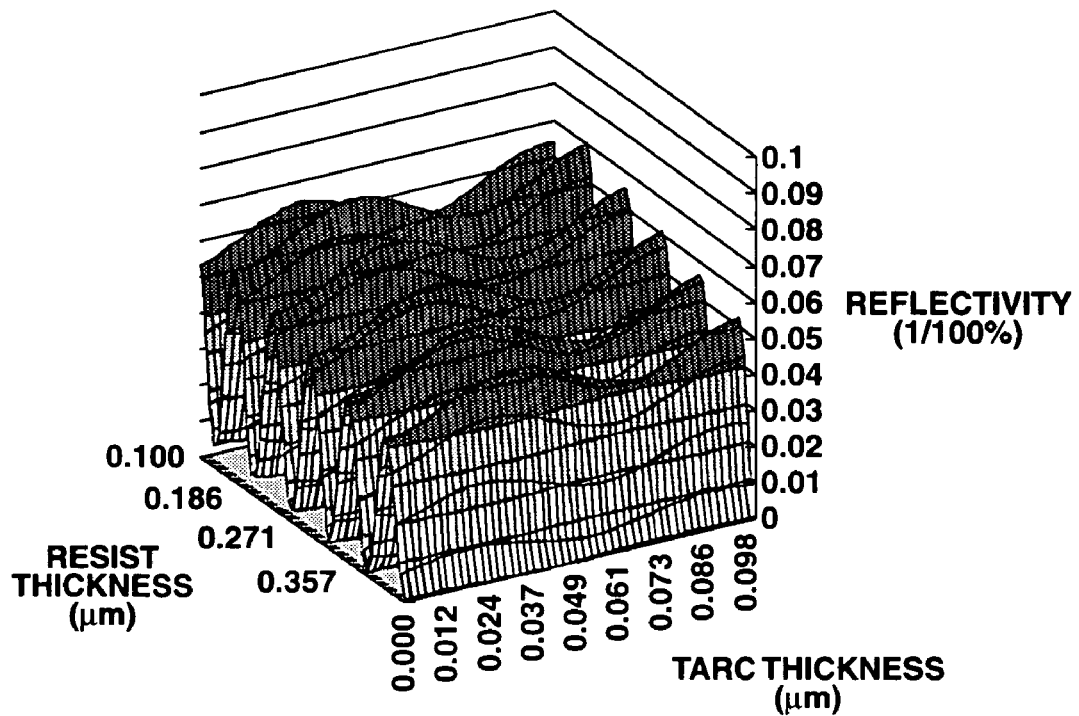
FIG. 2 is a graph of simulated reflectivity for TARC having a refractive index of 1.4.
Figure 3:
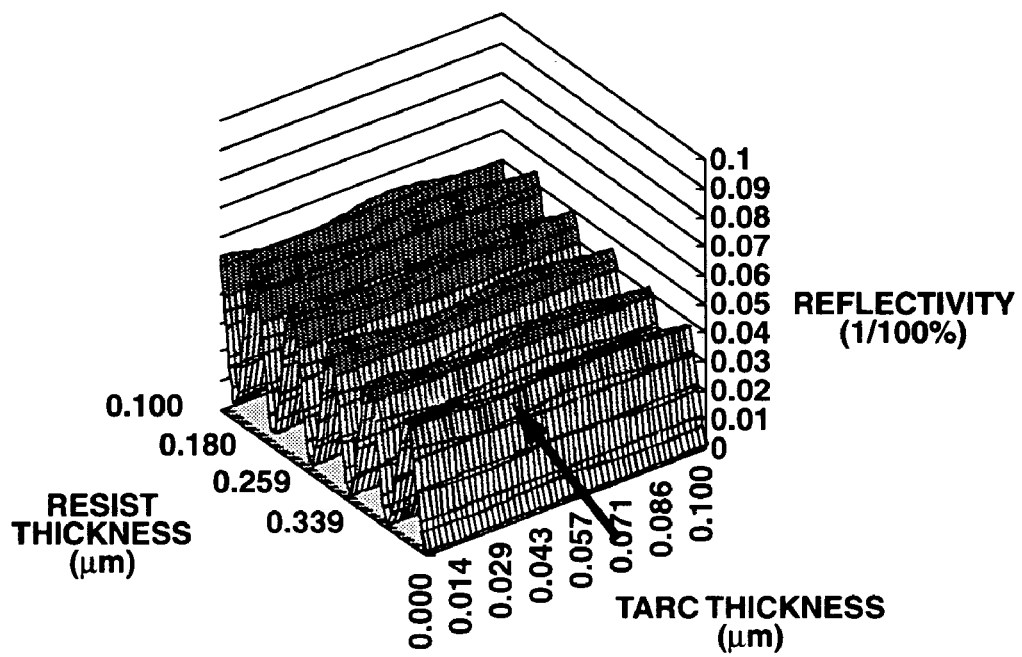
FIG. 3 is a graph of simulated reflectivity for TARC having a refractive index of 1.45.
Figure 4:
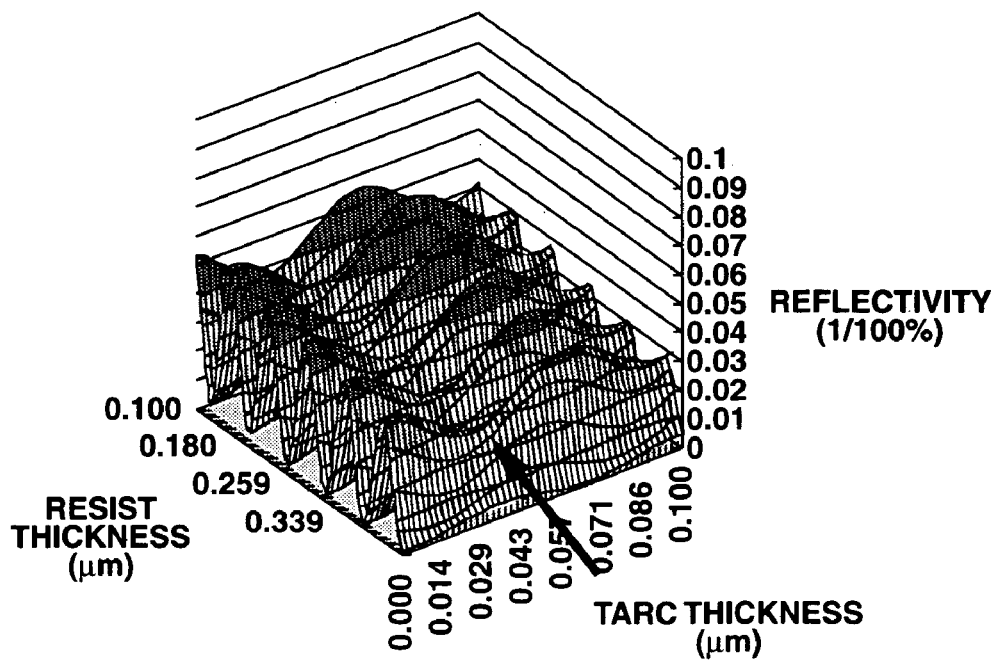
FIG. 4 is a graph of simulated reflectivity for TARC having a refractive index of 1.5.
Figure 5:
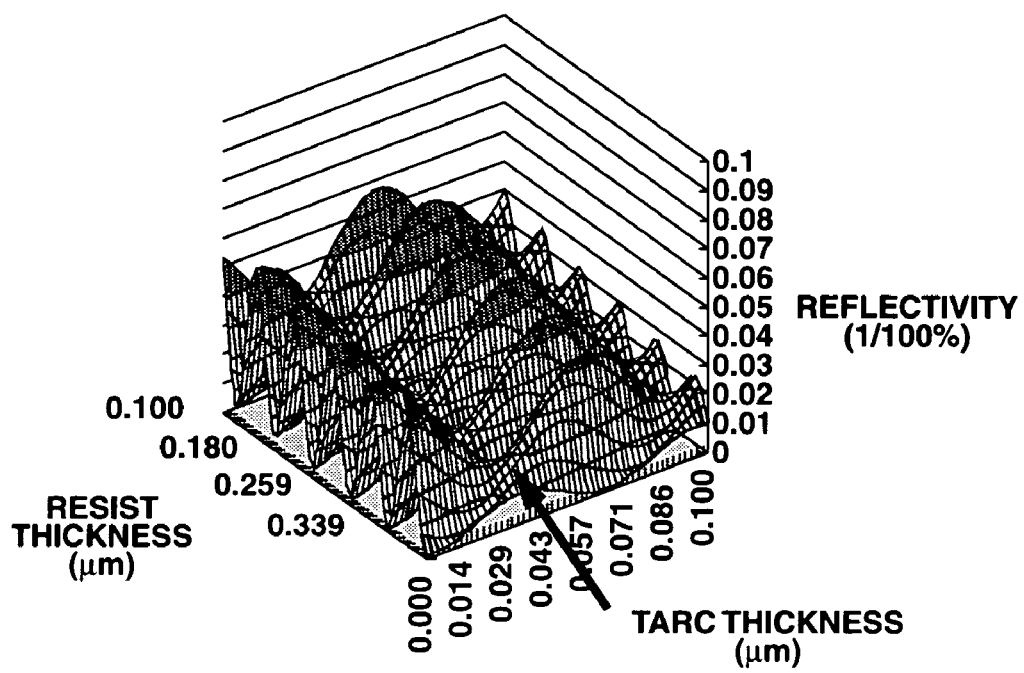
FIG. 5 is a graph of simulated reflectivity for TARC having a refractive index of 1.55.
Figure 6:
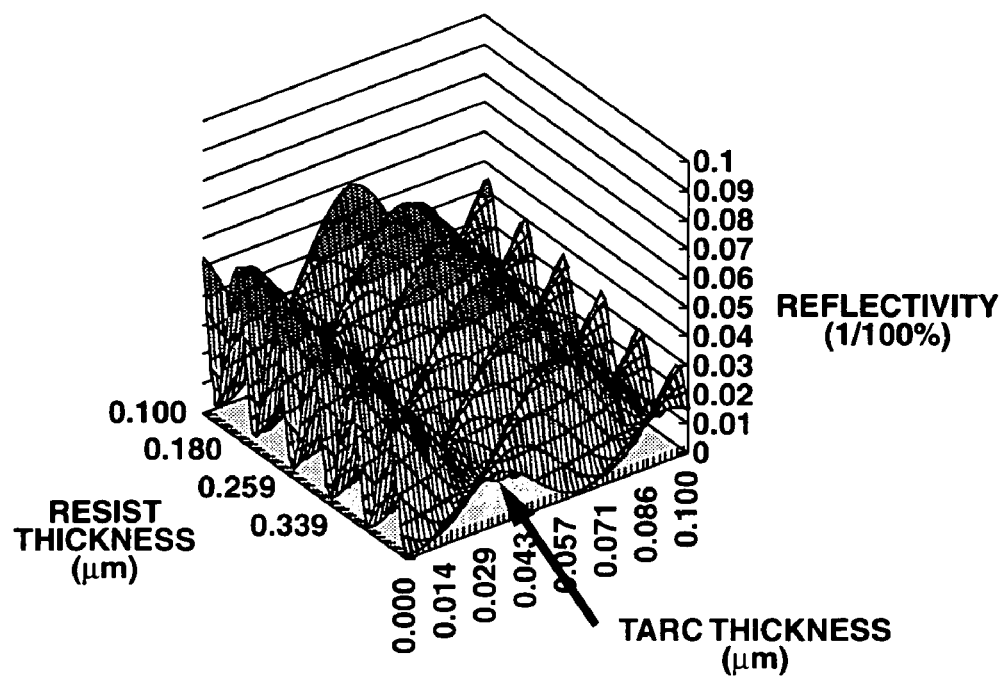
FIG. 6 is a graph of simulated reflectivity for TARC having a refractive index of 1.6.
Figure 7:
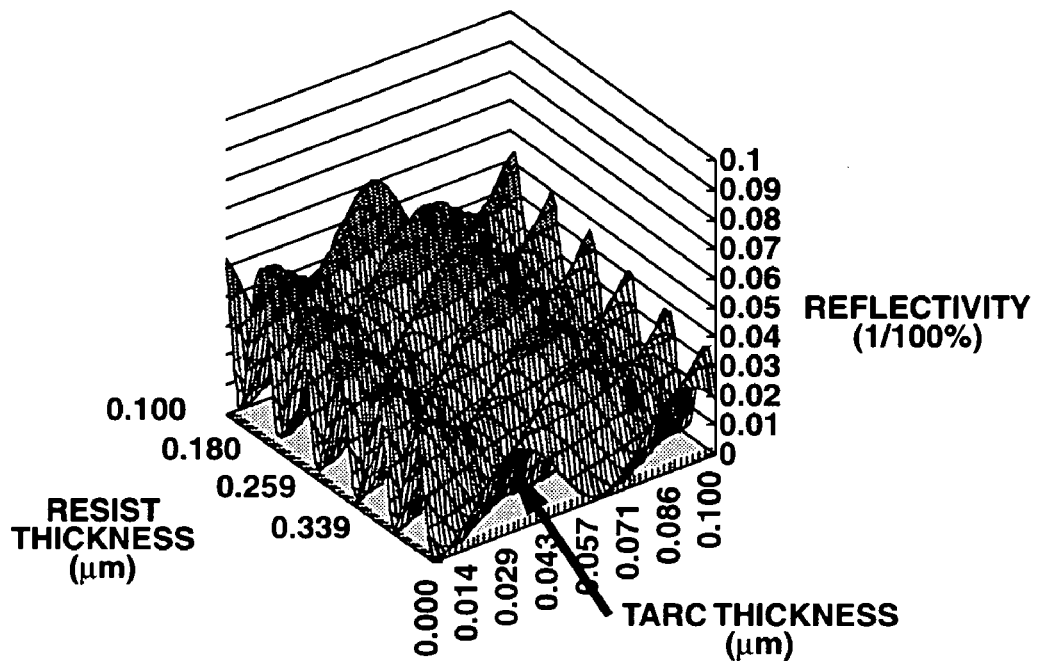
FIG. 7 is a graph of simulated reflectivity for TARC having a refractive index of 1.65.
Figure 8:
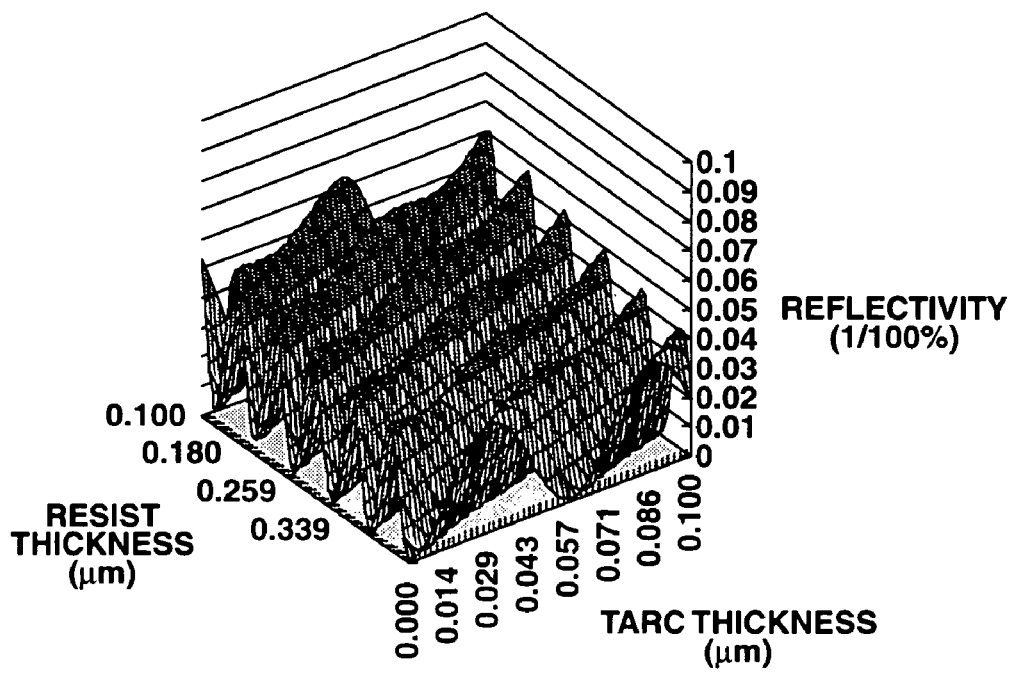
FIG. 8 is a graph of simulated reflectivity for TARC having a refractive index of 1.7.

The resist overcoat material used in immersion lithography according to the invention may be any material as long as it is insoluble in water, soluble in alkali (dissolvable in alkaline developer liquid), and immiscible with the photoresist layer. Preferably the resist overcoat material comprises a polymer having copolymerized recurring units containing fluorine and recurring units having alkali-soluble hydrophilic groups. The latter recurring units having alkali-soluble hydrophilic groups are typically recurring units having sulfo or carboxyl groups.

More preferably, the recurring units containing fluorine are recurring units selected from the following general formulae (1) and (2), and the recurring units having sulfo or carboxyl groups are recurring units selected from the following general formulae (3) to (7).

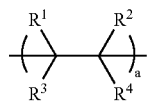

(1)

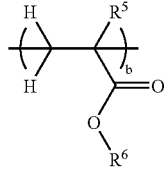

(2)

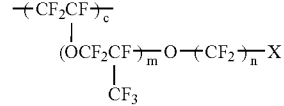

(3)

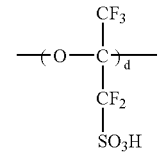

(4)

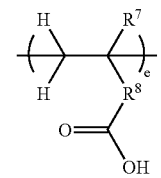

(5)

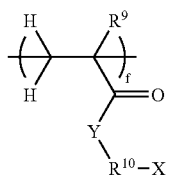

(6)

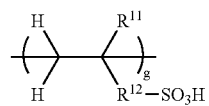

(7)

Herein $R^1$ to $R^4$ are independently selected from among hydrogen atoms, fluorine atoms, C$_1$-C$_{10}$ alkyl groups, partially or fully fluorine-substituted C$_1$-C$_{10}$ alkyl groups, and partially or fully fluorine-substituted C$_1$-C$_{10}$ alkyl ether groups, which may have hydroxyl groups. $R^3$ and $R^4$ may bond together to form a ring with the carbon atoms to which they are attached. Either one of $R^1$ to $R^4$ should contain at least one fluorine atom. $R^5$ is hydrogen, fluorine, methyl, trifluoromethyl or —CH$_2$C(=O)OH. $R^6$ is a straight, branched or cyclic C$_1$-C$_{20}$ alkyl group which may have an ester (—COO—), ether (—O—), hydroxy (—OH) or amide (—NHCO—) group and which should contain at least one fluorine atom. $R^7$ is hydrogen, fluorine, methyl or trifluoromethyl. $R^8$ is a single bond or a straight, branched or cyclic C$_1$-C$_4$ alkylene group which may have an ether group. $R^9$ and $R^{11}$ each are hydrogen or methyl. $R^{10}$ is a C$_1$-C$_{10}$ alkylene group. $R^{12}$ is a single bond or a straight, branched or cyclic C$_1$-C$_4$ alkylene group. X is a carboxyl or sulfo group. Y is —O— or —NH—. The subscript m is an integer of 0 to 10, preferably 1 to 8, and n is an integer of 1 to 10, preferably 1 to 8.

Suitable alkyl groups include methyl, ethyl, propyl, isopropyl, butyl, isobutyl, tert-butyl, pentyl, cyclopentyl, hexyl, cyclohexyl, octyl and decyl. Suitable alkylene groups are the foregoing alkyl groups with one hydrogen atom being eliminated.
Illustrative examples of the recurring units of formula (1) are given below.
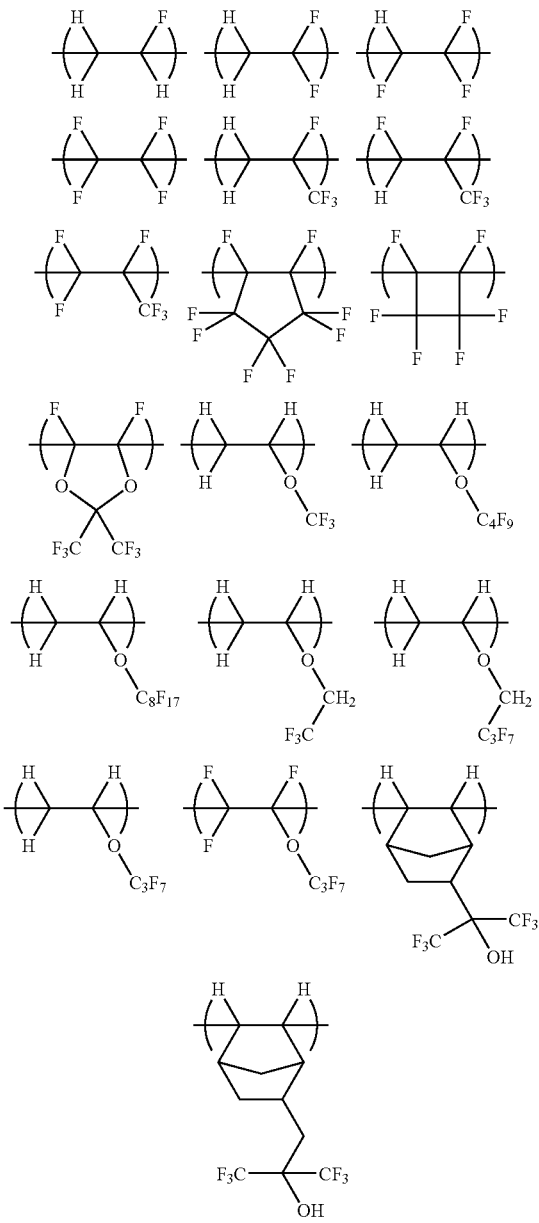
Illustrative examples of the recurring units of formula (2) are given below.
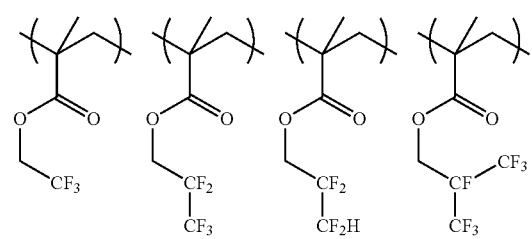
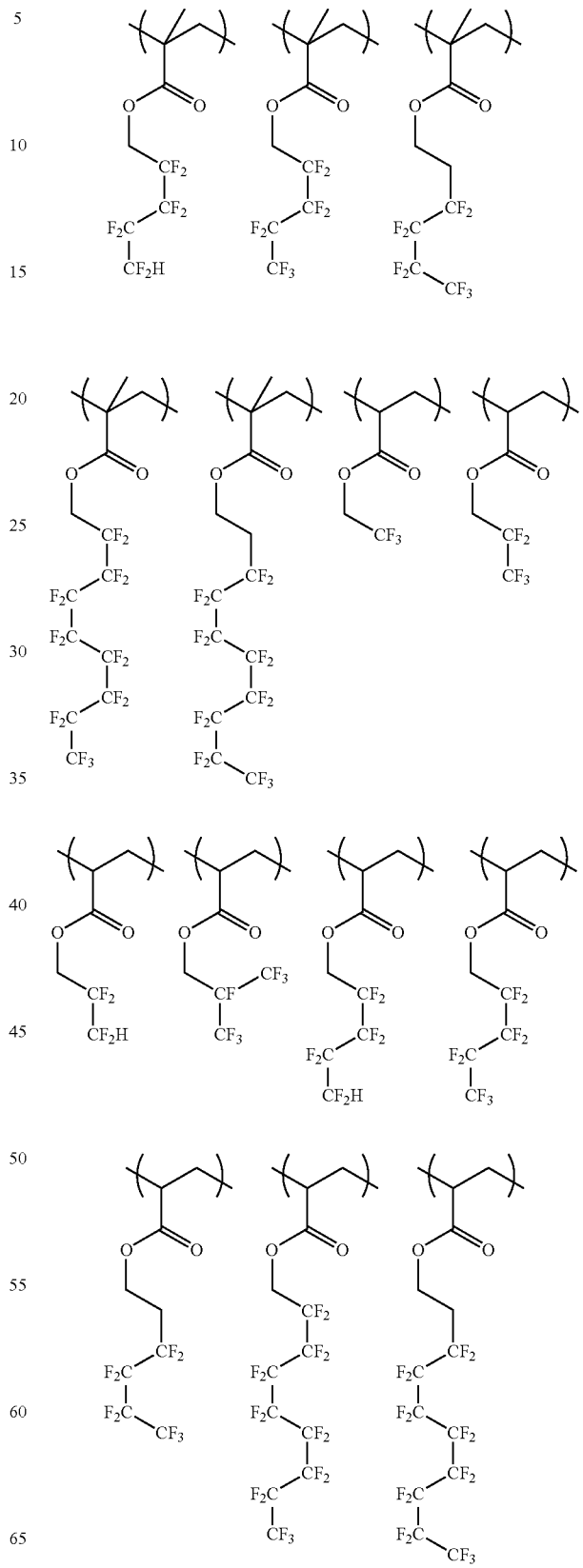

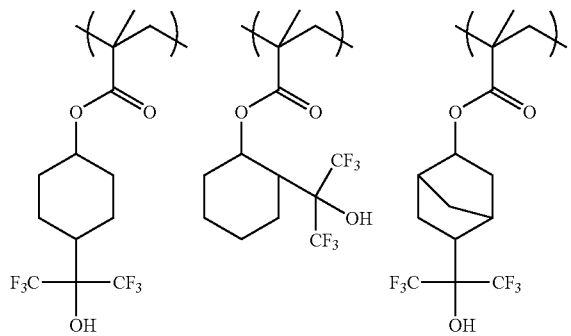
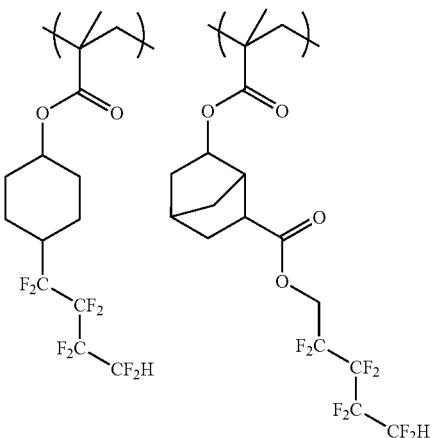
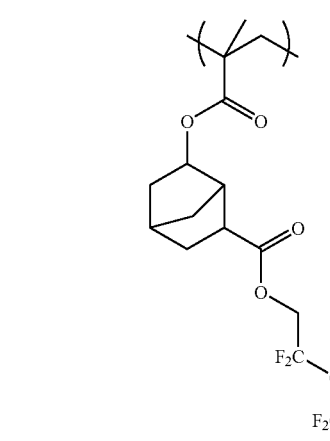
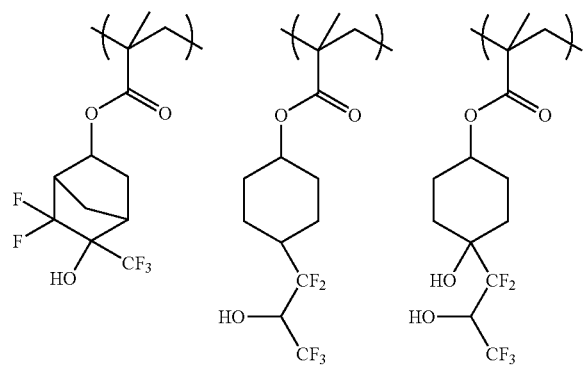
Illustrative examples of the recurring units of formula (3) are given below.
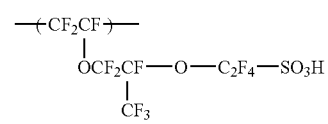
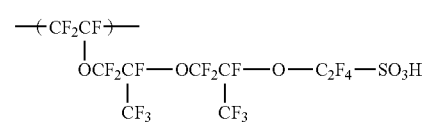
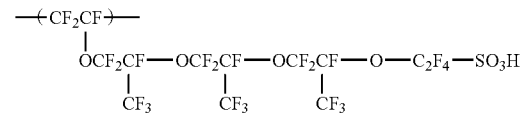
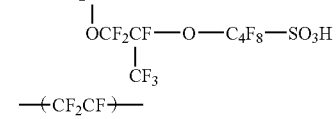
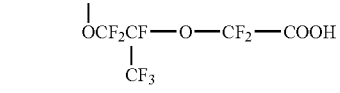

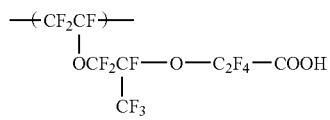
Illustrative examples of the recurring units of formula (5) are given below.
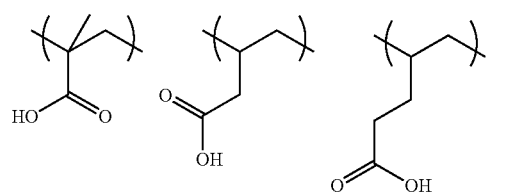
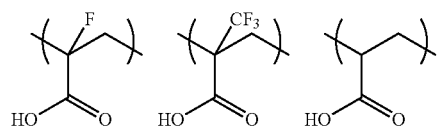
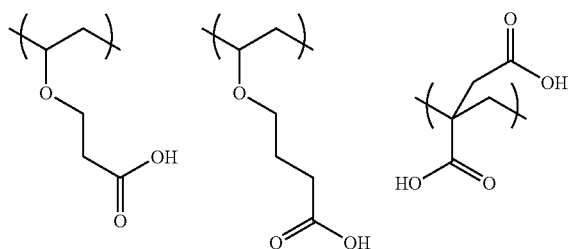
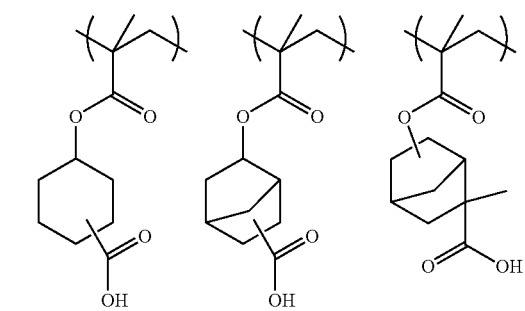
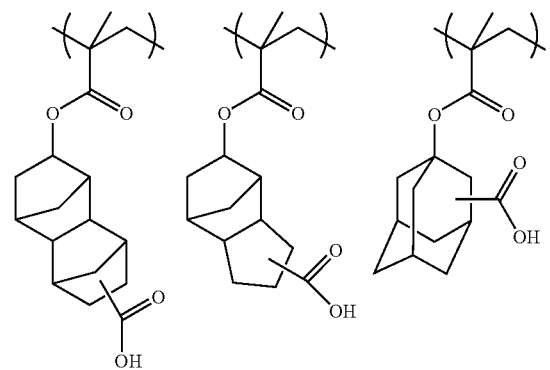
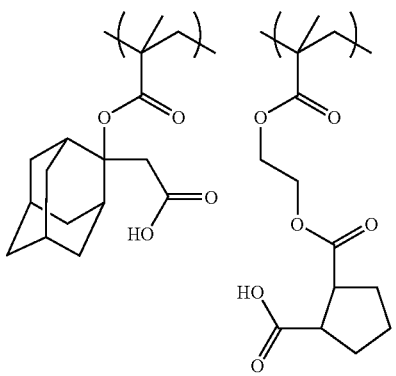
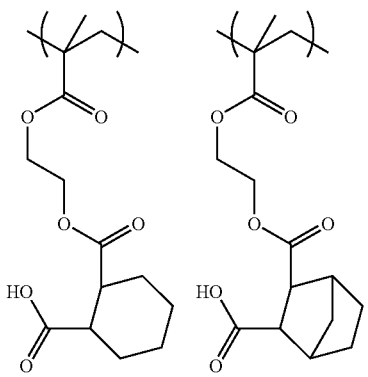
Illustrative examples of the recurring units of formula (6) are given below.
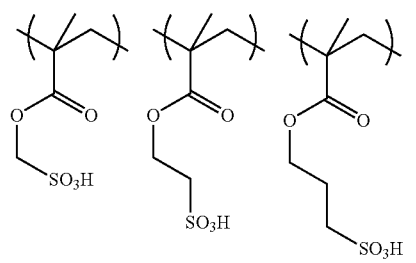
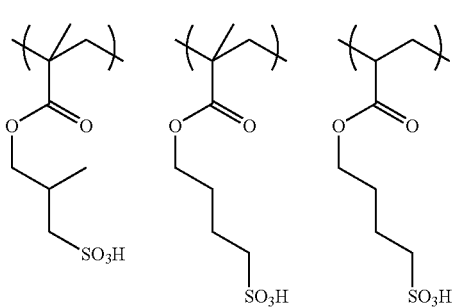

-continued

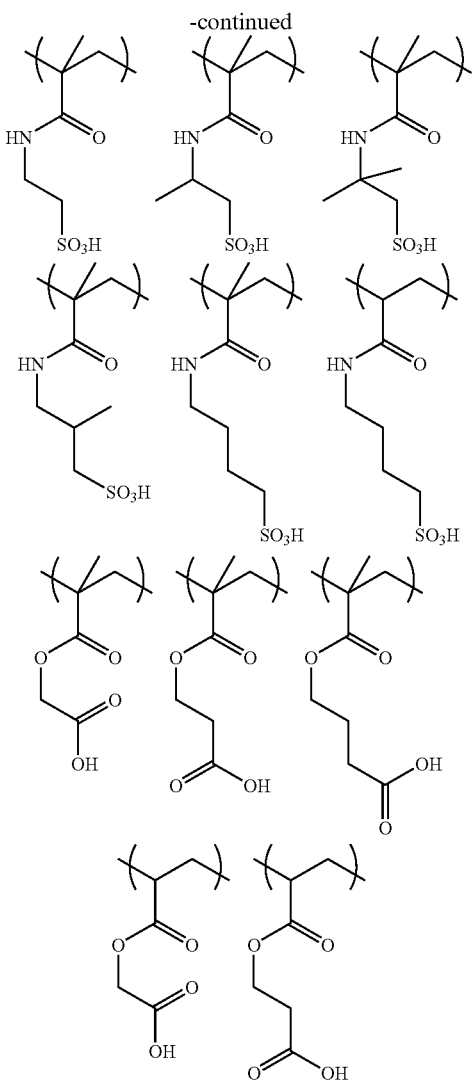

Illustrative examples of the recurring units of formula (7) are given below.

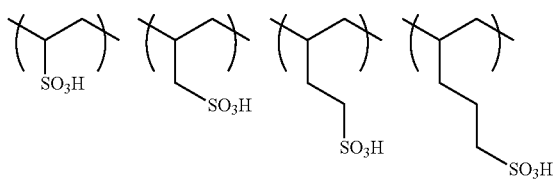

In the polymer, the recurring units having formulae (1) to (7) are present in molar proportions a, b, c, d, e, f and g, respectively, which should satisfy the range: $0 \leq a < 1.0$, $0 \leq b < 1.0$, and $0 < a+b < 1.0$, preferably $0 \leq a \leq 0.9$, $0 \leq b \leq 0.9$, and $0.1 \leq a+b \leq 0.9$, and $0 \leq c < 1.0$, $0 \leq d < 1.0$, $0 \leq e < 1.0$, $0 \leq f < 1.0$, $0 \leq g < 1.0$, and $0 < c+d+e+f+g < 1.0$, preferably $0 \leq c \leq 0.9$, $0 \leq d \leq 0.9$, $0 \leq e \leq 0.9$, $0 \leq f \leq 0.9$, $0 \leq g \leq 0.9$, and $0.1 \leq c+d+e+f+g \leq 0.9$.

The polymer can be made alkali-soluble and water-insoluble by controlling the proportion of the total (a+b) of recurring units containing fluorine to the total (c+d+e+f+g) of recurring units having sulfo or carboxyl groups. A relatively high proportion (a+b) of fluorine-containing units improves water insolubility, but too high a proportion (a+b) leads to a decline of alkali solubility. A relatively high proportion (c+d+e+f+g) of alkali-soluble group units improves alkali solubility, but too high a proportion (c+d+e+f+g) leads to difficulty to dissolve in water.

In the polymer used as the resist overcoat material, a fluorine-free monomer may be copolymerized for adjusting a refractive index. Suitable monomers include (meth)acrylates which have straight, branched or cyclic alkyl groups of 1 to 20 carbon atoms and which may contain ether, ester, lactone or the like. The molar proportion h of recurring units derived from the fluorine-free monomer for refractive index adjustment is from 0 mol % to 70 mol % of the entire polymer. When the refractive index-adjusting units are incorporated, the proportion h is more than 0 mol %, and desirably at least 5 mol % of the entire polymer.

Also in the polymer, a monomer or monomers other than formulae (1) to (7) may be copolymerized. Such additional monomers include (meth)acrylic derivatives, vinyl ether derivatives, norbornene derivatives, and norbornadiene derivatives. The molar proportion i of recurring units derived from the additional monomer is from 0 molt to 50 mol %, preferably 5 to 30 mol % of the entire polymer.

It is understood that $a+b+c+d+e+f+g+h+i=100$ mol %.

The polymer used in the resist overcoat material should preferably have a weight average molecular weight (Mw) of 1,000 to 500,000, more preferably 2,000 to 30,000, as determined by gel permeation chromatography (GPC) versus polystyrene standards. A polymer with too low a Mw may be miscible with the resist material or dissolvable in water whereas too high a Mw may interfere with film formation after spin coating and lead to a decline of alkali solubility.

The polymer may be synthesized by any desired method, for example, by dissolving unsaturated bond-containing monomers corresponding to the respective units of formulae (1) to (7) and optional monomers in an organic solvent, adding a radical initiator thereto, and effecting heat polymerization. Examples of the organic solvent which can be used for polymerization include toluene, benzene, tetrahydrofuran, diethyl ether, dioxane, methanol, ethanol and isopropanol. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. The sulfo group in the monomer stage may take the form of an alkali metal salt, which after polymerization can be acid treated for conversion to a sulfonic acid residue.

In the practice of the invention, the polymer comprising the recurring units described above is dissolved in a suitable solvent to form a resist protective coating solution which is ready for use as the resist overcoat material. The solvent used herein is not particularly limited although those solvents in which resists are dissolved should be avoided. It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Examples of the solvent in which resist layers are not dissolvable include nonpolar solvents such as higher alcohols of at least 4 carbon atoms, toluene, xylene, anisole, hexane and cyclohexane. Of these, higher alcohols of at least 4 carbon atoms are preferred. Suitable examples include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

Fluorinated solvents are also preferred because resist layers are not dissolvable therein. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-3-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol.

These solvents may be used alone or in combinations of two or more thereof. Of the above-described solvents, alkyl alcohols and fluorinated alkyl alcohols in which some or all of the hydrogen atoms attached to carbon atoms on alkyl alcohols are substituted with fluorine atoms are preferred. More preferred are alkyl alcohols of at least 4 carbon atoms, especially 4 to 6 carbon atoms, and fluorinated alkyl alcohols of at least 2 carbon atoms, especially 4 to 10 carbon atoms. The alkyl moieties include both linear and cyclic alkyls.

It is now described how to form a pattern using a water-insoluble, alkali-soluble resist overcoat material. First, the water-insoluble, alkali-soluble resist overcoat material is applied to a photoresist layer by suitable techniques, typically spin coating. The coating thickness is preferably in a range of 10 to 500 nm. After spin coating, the coating is baked at a temperature of 40 to 130° C. for 10 to 300 seconds for evaporating off the solvent. Then, light exposure in water is carried out by KrF or ArF immersion lithography. Following the exposure, water is spun off for drying. This is followed by post-exposure bake (PEB) at 60 to 180° C. for 10 to 30 seconds and development in an alkaline developer for 10 to 300 seconds. An aqueous solution of 2.38% tetramethylammonium hydroxide, which is commonly used as the alkaline developer, is used herein whereby stripping of the resist overcoating and development of the resist layer are simultaneously effected.

The type of photoresist material is not particularly limited, and any of well-known photoresist materials may be used. The photoresist may be either positive or negative working and also either a monolayer resist of conventional hydrocarbon or a bilayer resist containing silicon atoms or the like. For KrF lithography resist materials, the preferred base resins are polyhydroxystyrene or polyhydroxystyrene-(meth)acrylate copolymers in which hydrogen atoms of hydroxyl or carboxyl groups are replaced by acid labile groups.

For ArF lithography resist materials, the base resin must have an aromatic-free structure. Illustrative polymers include polyacrylic acid and derivatives thereof, norbornene derivative-maleic anhydride alternating copolymers and ternary or quaternary copolymers thereof with polyacrylic acid or derivatives thereof, tetracyclododecene derivative-maleic anhydride alternating copolymers and ternary or quaternary copolymers thereof with polyacrylic acid or derivatives thereof, norbornene derivative-maleimide alternating copolymers and ternary or quaternary copolymers thereof with polyacrylic acid or derivatives thereof, tetracyclododecene derivative-maleimide alternating copolymers and ternary or quaternary copolymers thereof with polyacrylic acid or derivatives thereof, and polynorbornene and metathesis ring-opening polymers, and a combination of any.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Synthesis Example 1

A 200-mL autoclave was charged with 7.5 g of perfluoro(4-methyl-3,6-dioxaoct-7-ene)sulfonyl fluoride, 20 g of (2-hydroxy-2,2-bistrifluoromethyl)ethylnorbornene, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 20 g of tetrafluoroethylene gas and 3 g of 2,2'-azobis(2,4-dimethylvaleronitrile) as a polymerization initiator, heated at 45° C., and held for 25 hours for reaction. The reaction solution was treated with a 5% sodium hydroxide aqueous solution for conversion to a sodium salt, then with a 3% nitric acid aqueous solution for conversion to sulfo groups. The solution was washed with water several times. A resin was isolated by crystallization from hexane. The resin, designated Inventive Polymer 1, was analyzed for composition by $^1$H-NMR and for molecular weight by GPC.

Synthesis Example 2

A 200-mL autoclave was charged with 10.5 g of allylsulfonic acid, 20 g of (2-hydroxy-2,2-bistrifluoro-methyl)ethylnorbornene, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 20 g of tetrafluoroethylene gas and 3 g of 2,2'-azobis(2,4-dimethyl-valeronitrile) as a polymerization initiator, heated at 45° C., and held for 25 hours for reaction. The reaction solution was poured into hexane for crystallization whereupon a resin was isolated. The resin, designated Inventive Polymer 2, was analyzed for composition by $^1$H-NMR and for molecular weight by GPC.

Synthesis Example 3

A 200-mL flask was charged with 36 g of 2,2,3,3,4,4,5,5-octafluoropentyl acrylate, 12.5 g of 5-[3,3,3-trifluoro-2-hydroxy-2-trifluoromethylpropyl]bicycle-[2.2.1]hept-2-yl methacrylate, 12 g of 4-sulfobutyl acrylate, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon a resin was isolated. The resin, designated Inventive Polymer 3, was analyzed for composition by $^1$H-NMR and for molecular weight by GPC.

Synthesis Example 4

A 200-mL flask was charged with 36 g of 2,2,3,3,4,4,5,5-octafluoropentyl acrylate, 7.5 g of acrylic acid, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethyl-valeronitrile) as a polymerization initiator, heated at 65° C., and held for 25 hours for reaction. The reaction solution was poured into hexane for crystallization whereupon a resin was isolated. The resin, designated Inventive Polymer 4, was analyzed for composition by $^1$H-NMR and for molecular weight by GPC.

Synthesis Example 5

A 200-mL flask was charged with 36 g of 2,2,3,3,4,4,5,5-octafluoropentyl acrylate, 11.5 g of 2-carboxyethyl acrylate, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon a resin was isolated. The resin, designated Inventive Polymer 5, was analyzed for composition by $^1$H-NMR and for molecular weight by GPC.

Synthesis Example 6

A 200-mL flask was charged with 36 g of 5-[3,3,3-trifluoro-2-hydroxy-2-trifluoromethylpropyl] methacrylate, 22 g of 4-carboxycyclohexyl methacrylate, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon a resin was isolated. The resin, designated Inventive Polymer 6, was analyzed for composition by $^1$H-NMR and for molecular weight by GPC.

Synthesis Example 7

A 200-mL flask was charged with 28 g of 5-hydroxy-5-trifluoromethyl-6,6-difluoro-bicyclo[2.2.1]hept-2-yl methacrylate, 11.5 g of methacrylic acid, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon a resin was isolated. The resin, designated Inventive Polymer 7, was analyzed for composition by $^1$H-NMR and for molecular weight by GPC.

Synthesis Example 8

A 200-mL flask was charged with 29 g of (2-hydroxy-2,2-bistrifluoromethyl)ethylnorbornene, 28 g of α-trifluoromethylacrylic acid, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon a resin was isolated. The resin, designated Inventive Polymer 8, was analyzed for composition by $^1$H-NMR and for molecular weight by GPC.

Comparative Synthesis Examples

Comparative Polymers 1 and 2 were synthesized by a similar method or a well-known method. Comparative Polymers 1 and 2 were insoluble in water and not dissolvable in alkaline developer.

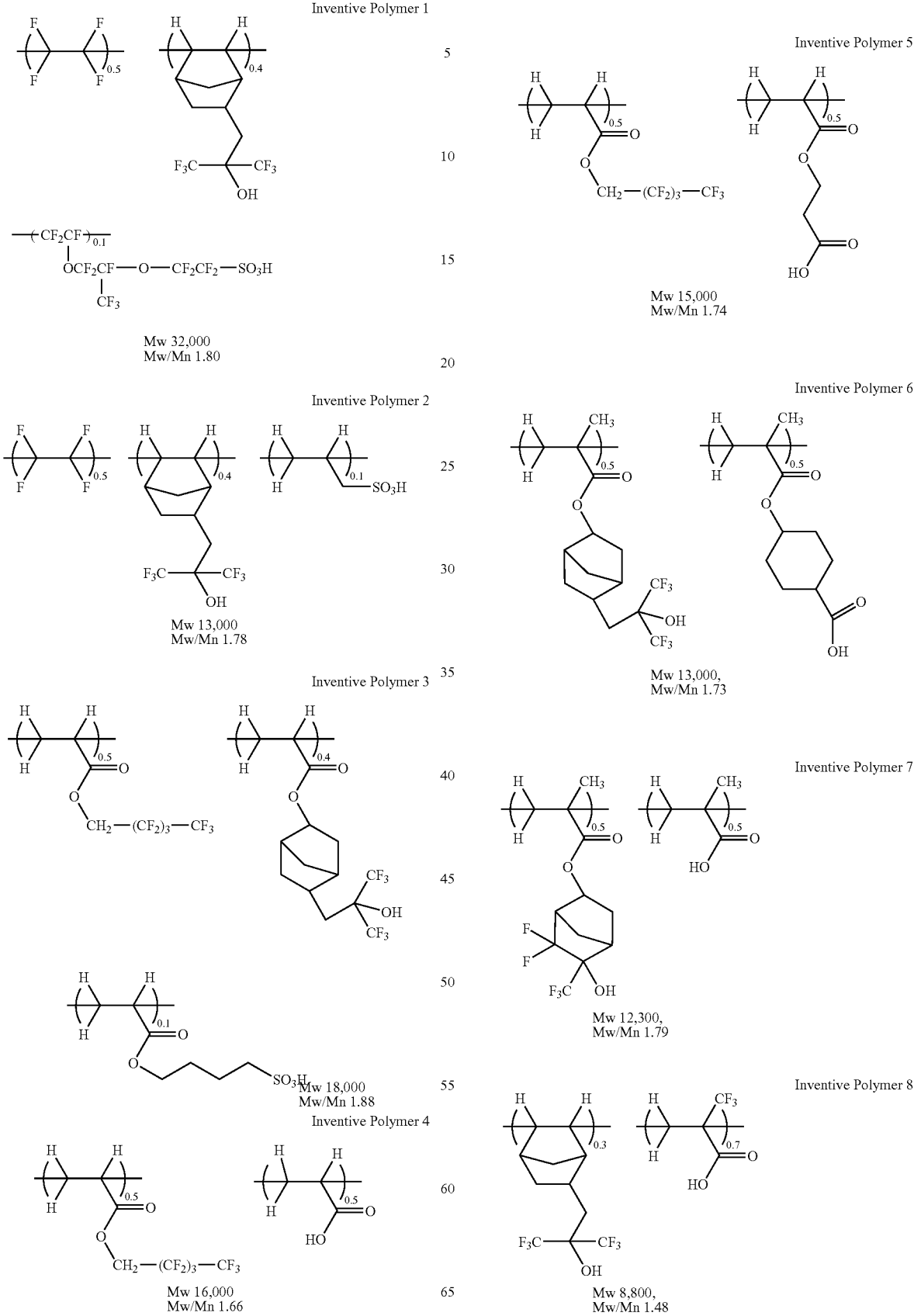

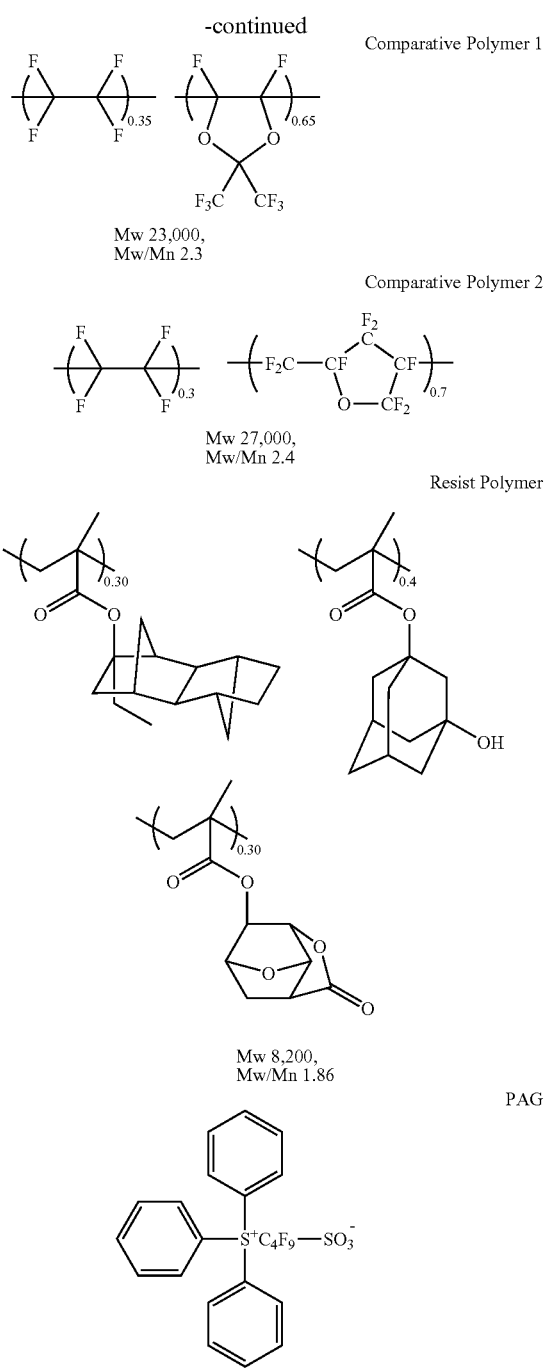

was applied onto the resist film and baked at 80° C. for 60 seconds. In order to simulate immersion lithography, after light exposure, the coating was rinsed with deionized water for 5 minutes. The structure was exposed by means of an ArF scanner model S305B (Nikon Corp., NA 0.68, σ0.85, ⅔ annular illumination, Cr mask), rinsed for 5 minutes while splashing deionized water, post-exposure baked (PEB) at 120° C. for 60 seconds, and developed with a 2.38% aqueous solution of tetramethylammonium hydroxide (TMAH) for 60 seconds.

In the absence of the protective coating, a similar process including light exposure, water rinsing, PEB and development was carried out; and a conventional process excluding water rinsing after exposure was also carried out.

The wafers were sectioned for comparing the profile of 110-nm line-and-space pattern and sensitivity. The results are shown in Table 1.

TABLE 1

| Protective coating polymer | Solvent | Sensitivity, 110 nm pattern profile |
|---|---|---|
| no protective coating, conventional process excluding rinsing after exposure | — | 30 mJ/cm², rectangular |
| Inventive Polymer 1 (1.0 g) | isobutyl alcohol (70 g) | 28 mJ/cm², rectangular |
| Inventive Polymer 2 (1.0 g) | isobutyl alcohol (70 g) | 29 mJ/cm², rectangular |
| Inventive Polymer 3 (1.0 g) | isobutyl alcohol (70 g) | 29 mJ/cm², rectangular |
| Inventive Polymer 4 (1.0 g) | isobutyl alcohol (70 g) | 31 mJ/cm², rectangular |
| Inventive Polymer 5 (1.0 g) | isobutyl alcohol (70 g) | 31 mJ/cm², rectangular |
| Inventive Polymer 6 (1.0 g) | isobutyl alcohol (70 g) | 31 mJ/cm², rectangular |
| Inventive Polymer 7 (1.0 g) | isobutyl alcohol (70 g) | 31 mJ/cm², rectangular |
| Inventive Polymer 8 (1.0 g) | isobutyl alcohol (70 g) | 31 mJ/cm², rectangular |
| Inventive Polymer 4 (1.0 g) | 2-methyl-1-butanol (70 g) | 31 mJ/cm², rectangular |
| Inventive Polymer 4 (1.0 g) | tert-amyl alcohol (70 g) | 31 mJ/cm², rectangular |
| Inventive Polymer 4 (1.0 g) | 2,2,3,4,4,4-hexafluoro-1-butanol (60 g) | 31 mJ/cm², rectangular |
| Inventive Polymer 4 (1.0 g) | 2,2,3,3-tetrafluoro-1-propanol (60 g) | 31 mJ/cm², rectangular |
| no protective coating | — | 30 mJ/cm², T-top |
| Comparative Polymer 1 (1.0 g) | perfluorotributylamine (60 g) | protective coating not stripped, pattern not resolved |
| Comparative Polymer 2 (1.0 g) | perfluorotributylamine (60 g) | protective coating not stripped, pattern not resolved |

A resist protective coating solution was prepared by dissolving each of Inventive Polymers 1 to 8 and Comparative Polymers 1 and 2 in a solvent as shown in Table 1. Separately, a resist solution was prepared by dissolving 5 g of the resist polymer, 0.15 g of PAG, and 0.4 g of tri-n-butylamine as a non-water-soluble quencher in 50 g of propylene glycol monomethyl ether acetate (PGMEA) and passing through a polypropylene filter having a pore size of 0.2 μm.

An antireflective coating ARC-29A (Nissan Chemical Co., Ltd.) was formed on a silicon substrate to a thickness of 87 nm. The resist solution was applied onto the antireflective coating and baked at 130° C. for 60 seconds, forming a resist film of 200 nm thick. The resist protective coating solution A resist protective coating solution was prepared by dissolving each of Inventive Polymers 1 to 8 and Comparative Polymers 1 and 2 in a solvent as shown in Table 2. Separately, a resist solution was prepared by dissolving 5 g of the resist polymer, 0.15 g of PAG, and 0.25 g of trismethoxymethoxyethylamine (TMMEA) as a water-soluble quencher in 50 g of PGMEA and passing through a polypropylene filter having a pore size of 0.2 μm.

An antireflective coating ARC-29A (Nissan Chemical Co., Ltd.) was formed on a silicon substrate to a thickness of 87 nm. The resist solution was applied onto the antireflective coating and baked at 130° C. for 60 seconds, forming a resist film of 200 nm thick. The resist protective coating solution was applied onto the resist film and baked at 80° C. for 60 seconds. In order to simulate immersion lithography, after light exposure, the coating was rinsed with deionized water. The structure was exposed by means of an ArF scanner model S305B (Nikon Corp., NA 0.68, σ0.85, ⅔ annular illumination, Cr mask), rinsed for 5 minutes while splashing deionized water, post-exposure baked (PEB) at 120° C. for 60 seconds, and developed with a 2.38% TMAH aqueous solution for 60 seconds.

In the absence of the protective coating, a similar process including light exposure, water rinsing, PEB and development was carried out; and a conventional process excluding water rinsing after exposure was also carried out.

The wafers were sectioned for comparing the profile of 110-nm line-and-space pattern and sensitivity. The results are shown in Table 2.

TABLE 2

| Protective coating polymer | Solvent | Sensitivity, 110 nm pattern profile |
|---|---|---|
| no protective coating, conventional process excluding rinsing after exposure | — | 30 mJ/cm², rectangular |
| Inventive Polymer 1 (1.0 g) | isobutyl alcohol (70 g) | 28 mJ/cm², rectangular |
| Inventive Polymer 2 (1.0 g) | isobutyl alcohol (70 g) | 29 mJ/cm², rectangular |
| Inventive Polymer 3 (1.0 g) | isobutyl alcohol (70 g) | 29 mJ/cm², rectangular |
| Inventive Polymer 4 (1.0 g) | isobutyl alcohol (70 g) | 31 mJ/cm², rectangular |
| Inventive Polymer 5 (1.0 g) | isobutyl alcohol (70 g) | 31 mJ/cm², rectangular |
| Inventive Polymer 6 (1.0 g) | isobutyl alcohol (70 g) | 31 mJ/cm², rectangular |
| Inventive Polymer 7 (1.0 g) | isobutyl alcohol (70 g) | 31 mJ/cm², rectangular |
| Inventive Polymer 8 (1.0 g) | isobutyl alcohol (70 g) | 31 mJ/cm², rectangular |
| Inventive Polymer 4 (1.0 g) | 2-methyl-1-butanol (70 g) | 31 mJ/cm², rectangular |
| Inventive Polymer 4 (1.0 g) | tert-amyl alcohol (70 g) | 31 mJ/cm², rectangular |
| Inventive Polymer 4 (1.0 g) | 2,2,3,4,4,4-hexafluoro-1-butanol (60 g) | 31 mJ/cm², rectangular |
| Inventive Polymer 4 (1.0 g) | 2,2,3,3-tetrafluoro-1-propanol (60 g) | 31 mJ/cm², rectangular |
| no protective coating | — | 30 mJ/cm², T-top |
| Comparative Polymer 1 (1.0 g) | perfluorotributylamine (60 g) | protective coating not stripped, pattern not resolved |
| Comparative Polymer 2 (1.0 g) | perfluorotributylamine (60 g) | protective coating not stripped, pattern not resolved |

A pattern was formed by applying a solution of each of Comparative Polymers 1 and 2 in perfluorotributylamine onto a resist film to form a protective coating, exposing, PEB, rinsing with deionized water, rinsing with perfluoro-2-butyltetrahydrofuran to strip off the protective coating, PEB, and development.

The wafers were sectioned for comparing the profile of 110-nm line-and-space pattern and sensitivity. The results are shown in Table 3.

TABLE 3

| Protective coating polymer | Solvent | Sensitivity, 110 nm pattern profile |
|---|---|---|
| Comparative Polymer 1 (1.0 g) | perfluorotributylamine (60 g) | 30 mJ/cm², rectangular |
| Comparative Polymer 2 (1.0 g) | perfluorotributylamine (60 g) | 30 mJ/cm², rectangular |

When exposure was followed by water rinsing in the absence of the protective coating, the pattern had a T-top profile. This is because the acid generated was dissolved in water. The pattern profile remained unchanged when the protective coating of the invention was used. With respect to the protective coatings of perfluoro-polymers proposed in the art, the pattern profile was acceptable when the coating was stripped with a fluorocarbon solvent, but the coating could not be stripped with alkaline water.

The protective coating solutions prepared above were spin coated on silicon substrates and baked at 80° C. for 60 seconds to form protective coatings of 35 nm thick. Using a spectroscopic ellipsometer by J. A. Woollam Co., Inc., the refractive index at wavelength 193 nm of the protective coatings was measured. The results are shown in Table 4.

TABLE 4

| Protective coating polymer | Refractive index at 193 nm |
|---|---|
| Inventive Polymer 1 | 1.54 |
| Inventive Polymer 2 | 1.55 |
| Inventive Polymer 3 | 1.56 |
| Inventive Polymer 4 | 1.53 |
| Inventive Polymer 5 | 1.50 |
| Inventive Polymer 6 | 1.56 |
| Inventive Polymer 7 | 1.58 |
| Inventive Polymer 8 | 1.54 |
| Comparative Polymer 1 | 1.38 |
| Comparative Polymer 2 | 1.37 |

Japanese Patent Application Nos. 2004-121506, 2004-244030 and 2004-305183 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

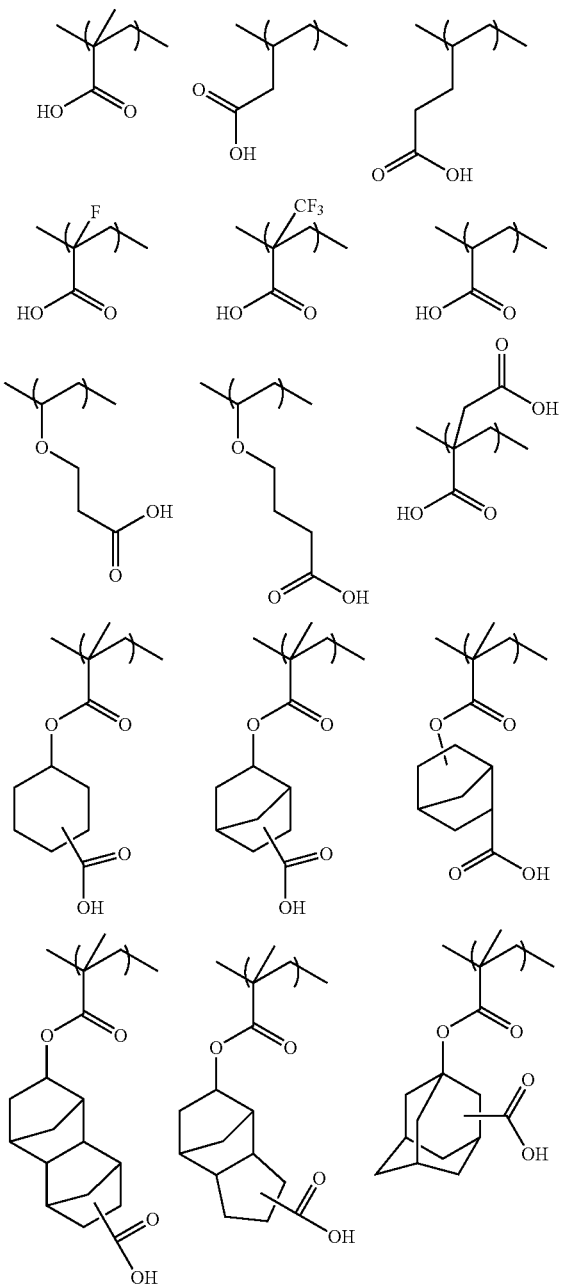

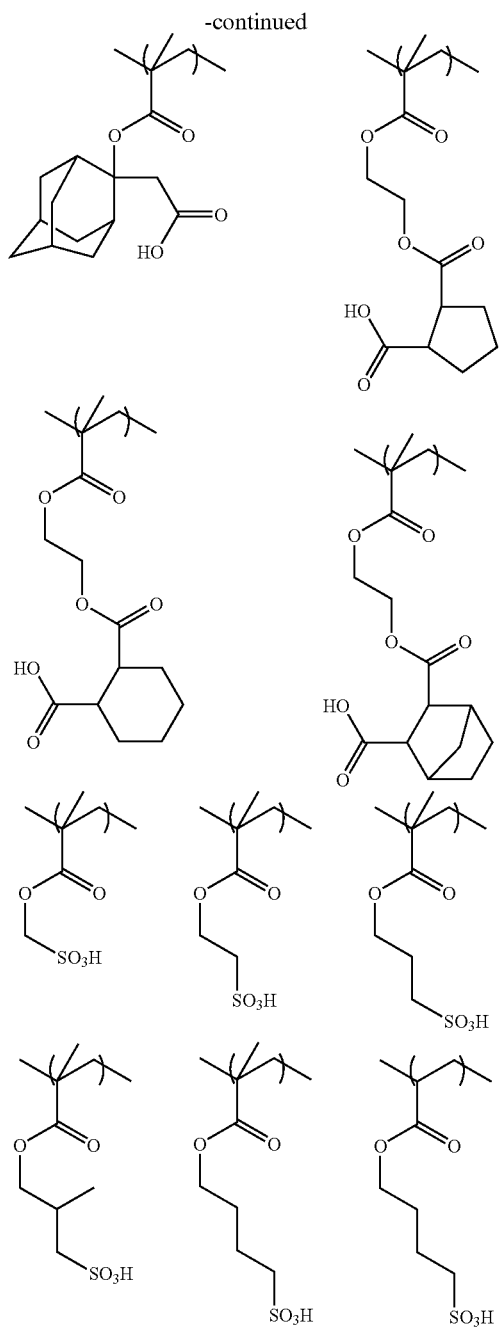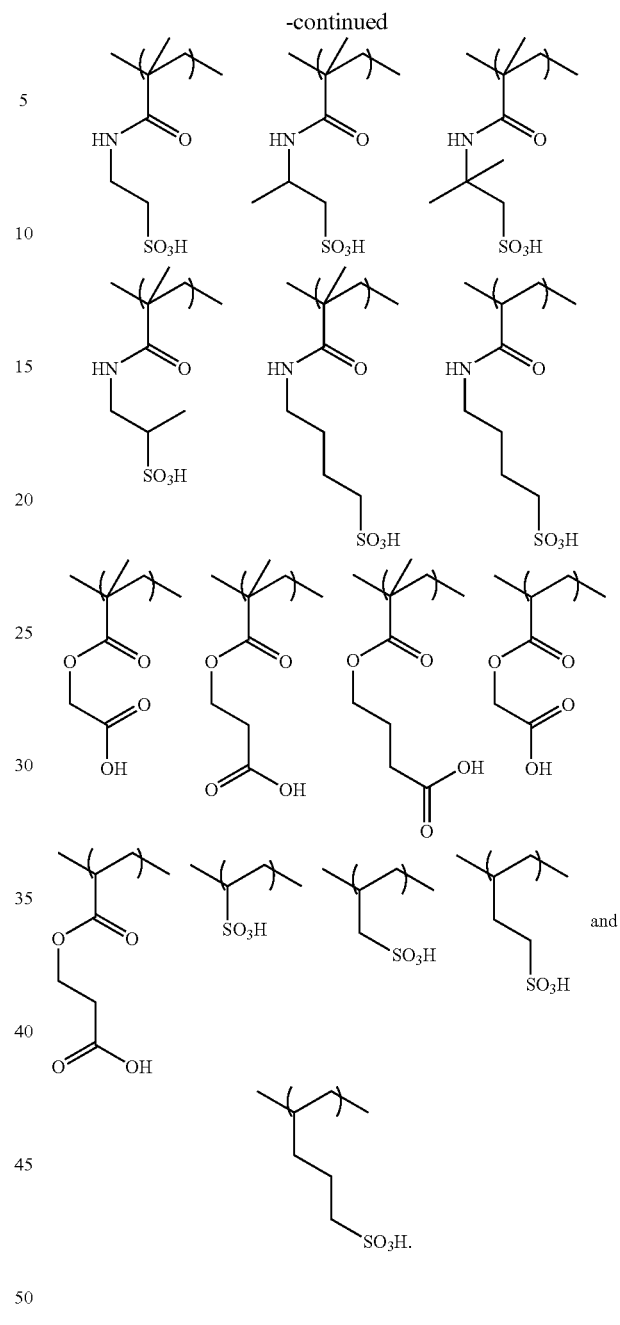

The invention claimed is:

1. A resist overcoat material for use in an immersion lithography process for forming a pattern, comprising the steps of forming a photoresist layer on a wafer, forming a protective coating on the photoresist layer from a resist overcoat material, exposing the layer structure to light in water, and developing, the resist overcoat material comprising a polymer having copolymerized recurring units containing fluorine and recurring units having sulfo groups, said recurring units containing fluorine being recurring units selected from the following general formulae (1) and (2), and said recurring units having sulfo groups being recurring units selected from the following general formulae (3) to (7):

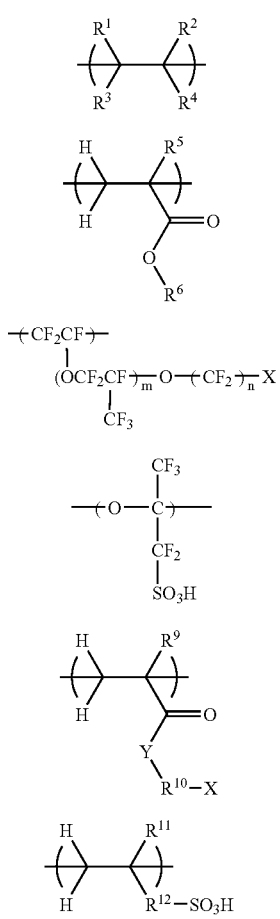

wherein $R^1$ to $R^4$ are independently selected from the class consisting of hydrogen atoms, fluorine atoms, $C_1$-$C_{10}$ alkyl groups, at least partially fluorine-substituted $C_1$-$C_{10}$ alkyl groups, and at least partially fluorine-substituted $C_1$-$C_{10}$ alkyl ether groups, which may have hydroxyl groups, or $R^3$ and $R^4$ may bond together to form a ring with the carbon atoms to which they are attached, either one of $R^1$ to $R^4$ should contain at least one fluorine atom; $R^5$ is hydrogen, fluorine, methyl, trifluoromethyl or —$CH_2C(=O)OH$; $R^6$ is a straight, branched or cyclic $C_1$-$C_{20}$ alkyl group which may have an ester, ether, hydroxy or amide group and which should contain at least one fluorine atom; $R^9$ and $R^{11}$ each are hydrogen or methyl; $R^{10}$ is a $C_1$-$C_{10}$ alkylene group; $R^{12}$ is a single bond or a straight, branched or cyclic $C_1$-$C_4$ alkylene group; X is a sulfo group; Y is —O— or —NH—; m is an integer of 0 to 10; and n is an integer of 1 to 10.

2. The resist overcoat material of claim 1, further comprising an alkyl alcohol or fluorinated alkyl alcohol.

3. The resist overcoat material of claim 1, wherein the recurring unit containing fluorine is at least one selected from the group consisting of units having the following formulae:

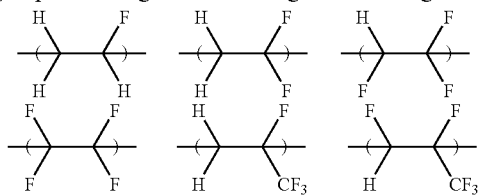

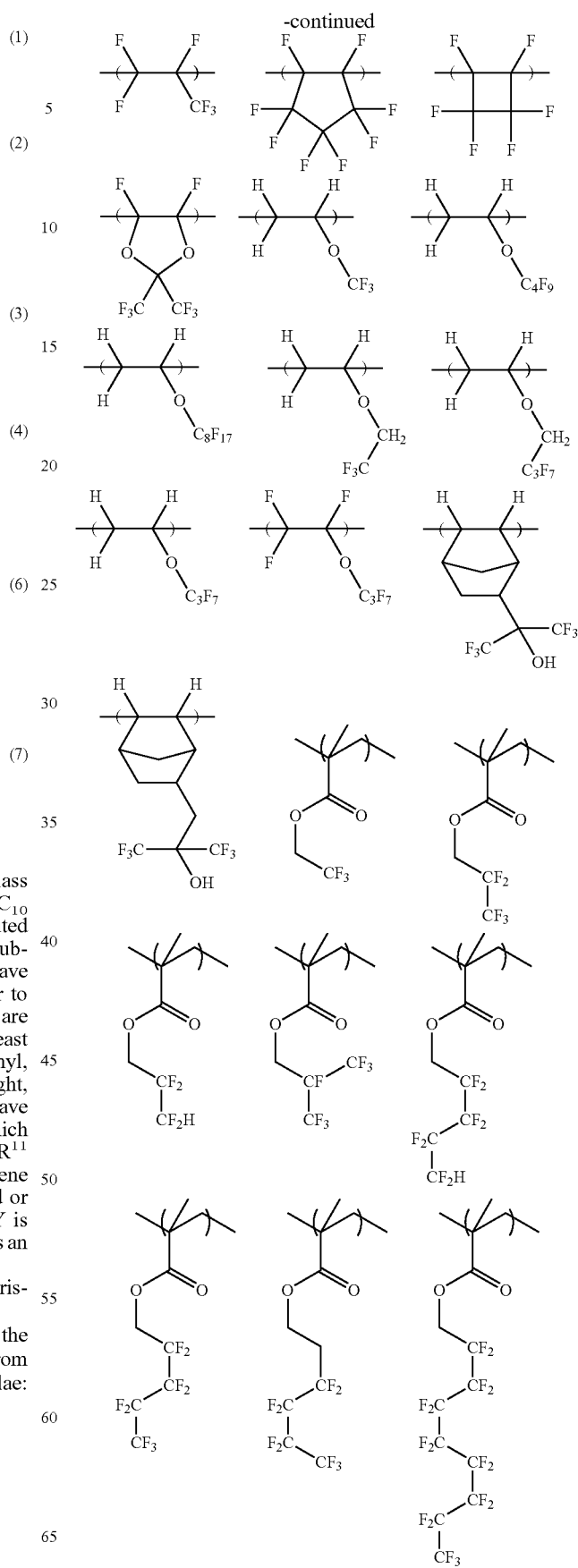

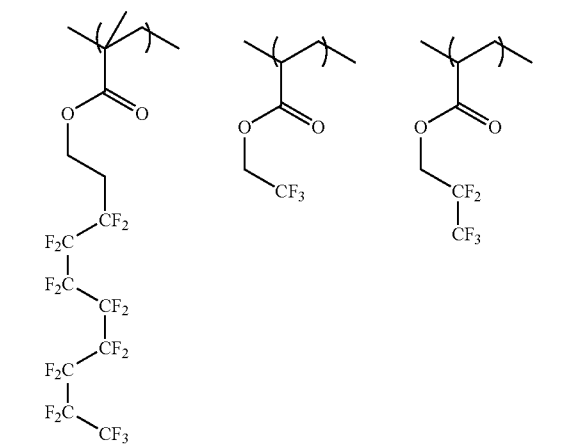
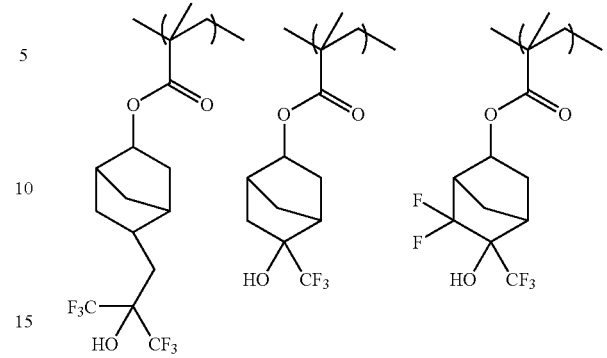
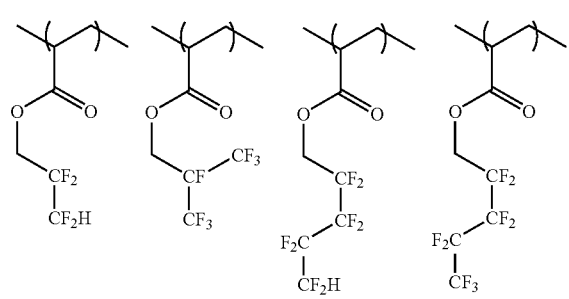
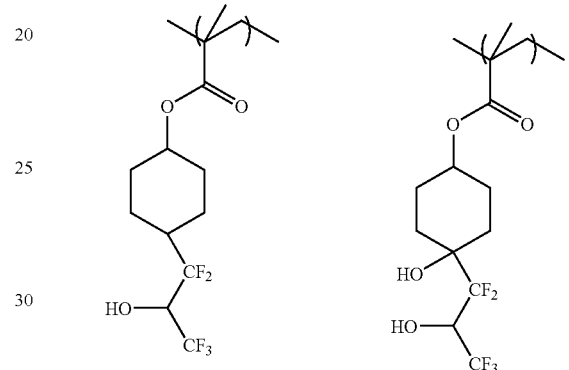
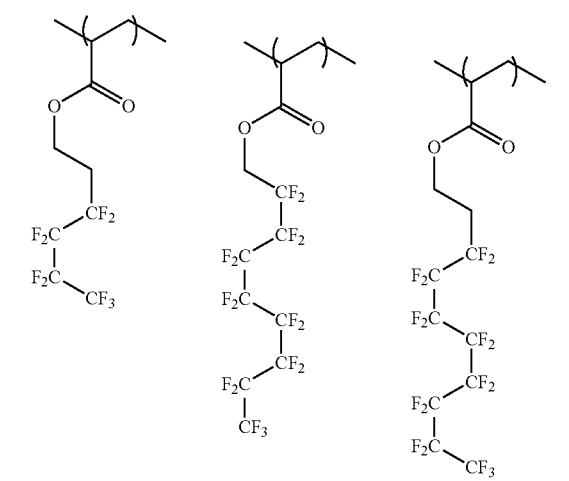
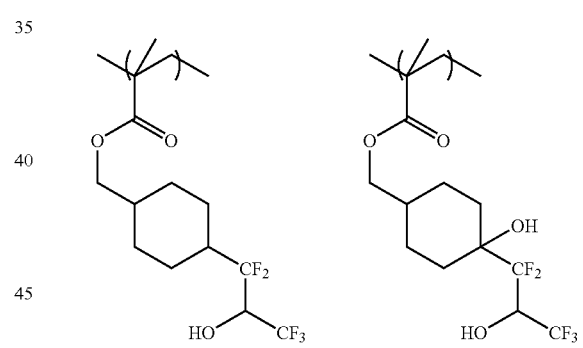
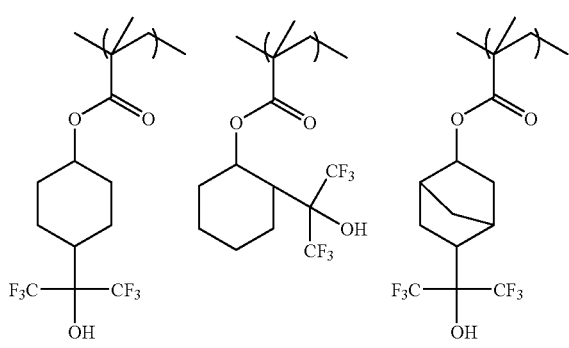
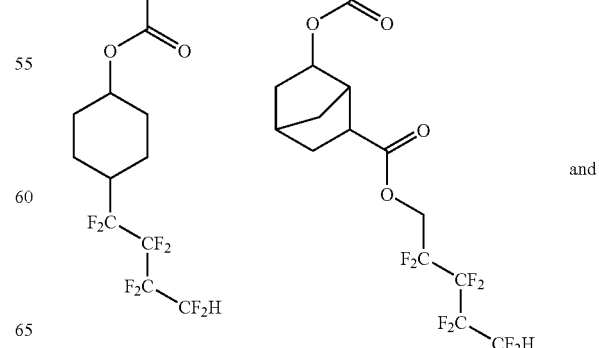
and
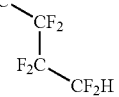

-continued

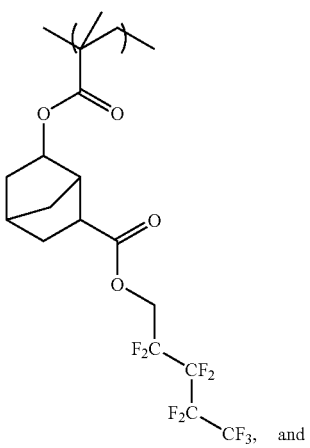

the recurring unit having sulfo group is at least one selected from the group consisting of units having the following formulae:

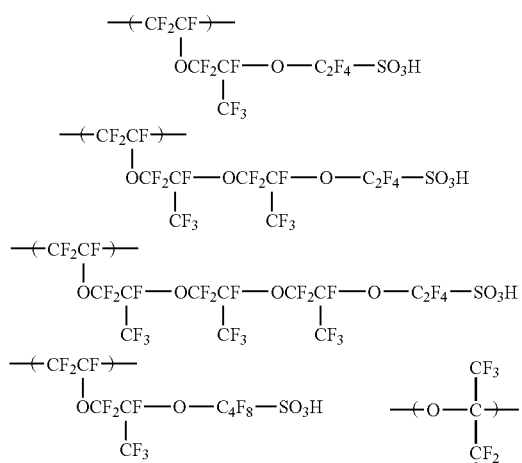

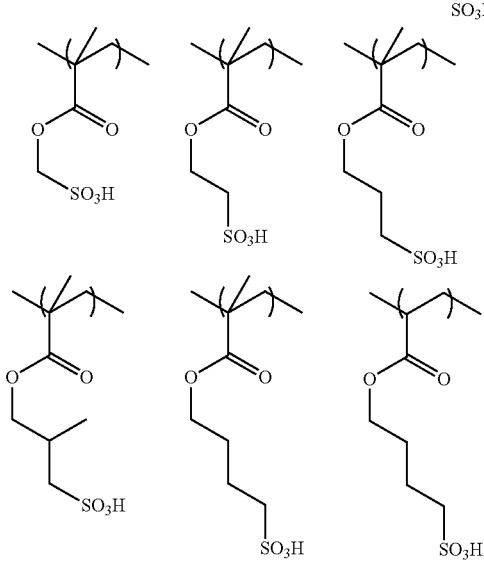

-continued

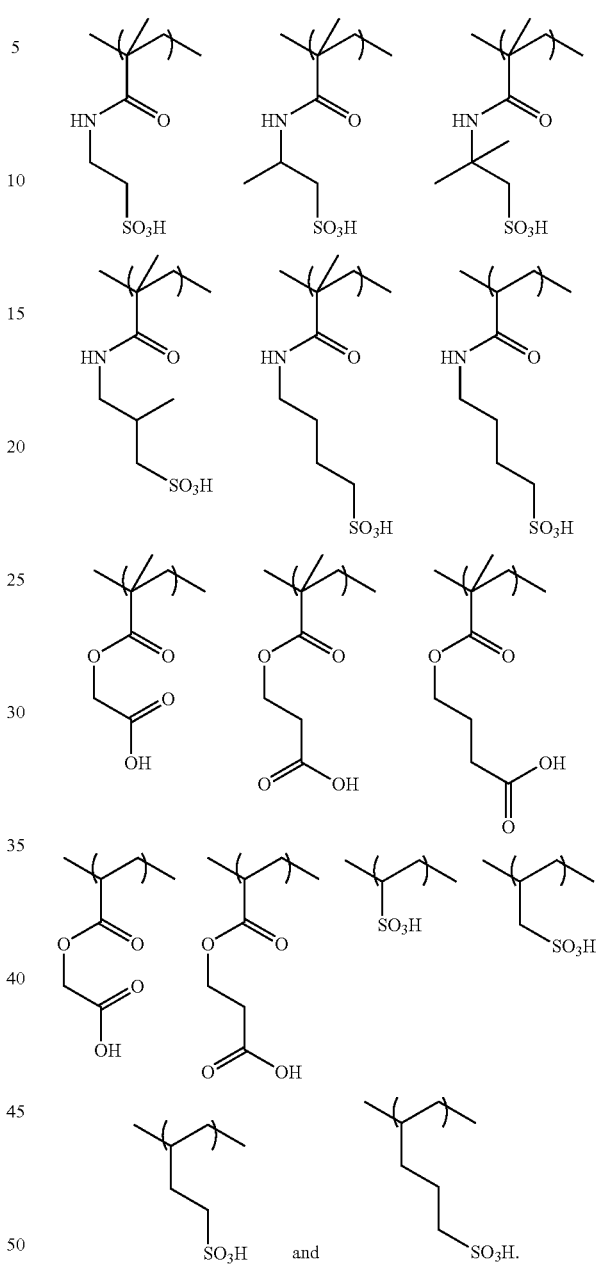

4. An immersion lithography process for forming a pattern, comprising the steps of forming a photoresist layer on a wafer, forming a protective coating on the photoresist layer from a resist overcoat material, exposing the layer structure to light in water, and developing, said resist overcoat material comprising a polymer having copolymerized recurring units containing fluorine and recurring units having sulfo or carboxyl groups, said recurring units containing fluorine being recurring units selected from the following general formulae (1) and (2), and said recurring units having sulfo groups being recurring units selected from the following general formulae (3) to (7):

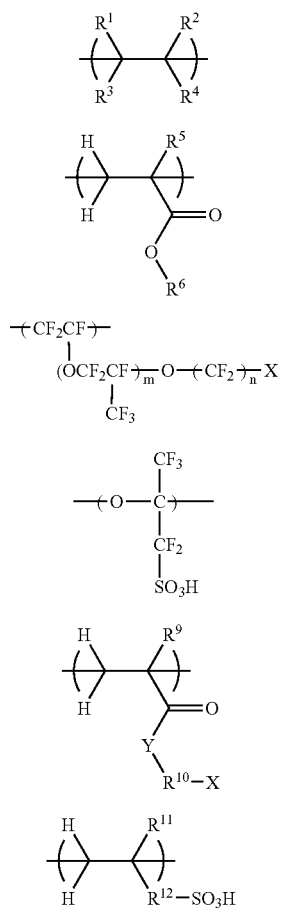

(1)
(2)
(3)
(4)
(6)
(7)

wherein $R^1$ to $R^4$ are independently selected from the class consisting of hydrogen atoms, fluorine atoms, $C_1$-$C_{10}$ alkyl groups, at least partially fluorine-substituted $C_1$-$C_{10}$ alkyl groups, and at least partially fluorine-substituted $C_1$-$C_{10}$ alkyl ether groups, which may have hydroxyl groups, or $R^3$ and $R^4$ may bond together to form a ring with the carbon atoms to which they are attached, either one of $R^1$ to $R^4$ should contain at least one fluorine atom; $R^5$ is hydrogen, fluorine, methyl, trifluoromethyl or —$CH_2C(=O)OH$; $R^6$ is a straight, branched or cyclic $C_1$-$C_{20}$ alkyl group which may have an ester, ether, hydroxy or amide group and which should contain at least one fluorine atom; $R^9$ and $R^{11}$ each are hydrogen or methyl; $R^{10}$ is a $C_1$-$C_{10}$ alkylene group; $R^{12}$ is a single bond or a straight, branched or cyclic $C_1$-$C_4$ alkylene group; X is a sulfo group; Y is —O— or —NH—; m is an integer of 0 to 10; and n is an integer of 1 to 10.

5. The pattern forming process of claim 4, wherein the exposing step includes directing radiation having a wavelength in the range of 180 to 250 nm from a projection lens toward the wafer, with water intervening between the projection lens and the wafer.

6. The pattern forming process of claim 4, wherein the exposing step includes directing radiation having a wavelength in the range of 180 to 250 nm from a projection lens toward the wafer, with water intervening between the projection lens and the wafer.

7. The pattern forming process of claim 4, wherein resist overcoat material further comprises as a solvent which does not dissolve the photoresist layer an alkyl alcohol or fluorinated alkyl alcohol.

8. The immersion lithography process of claim 4, wherein the recurring unit containing fluorine is at least one selected from the group consisting of units having the following formulae:

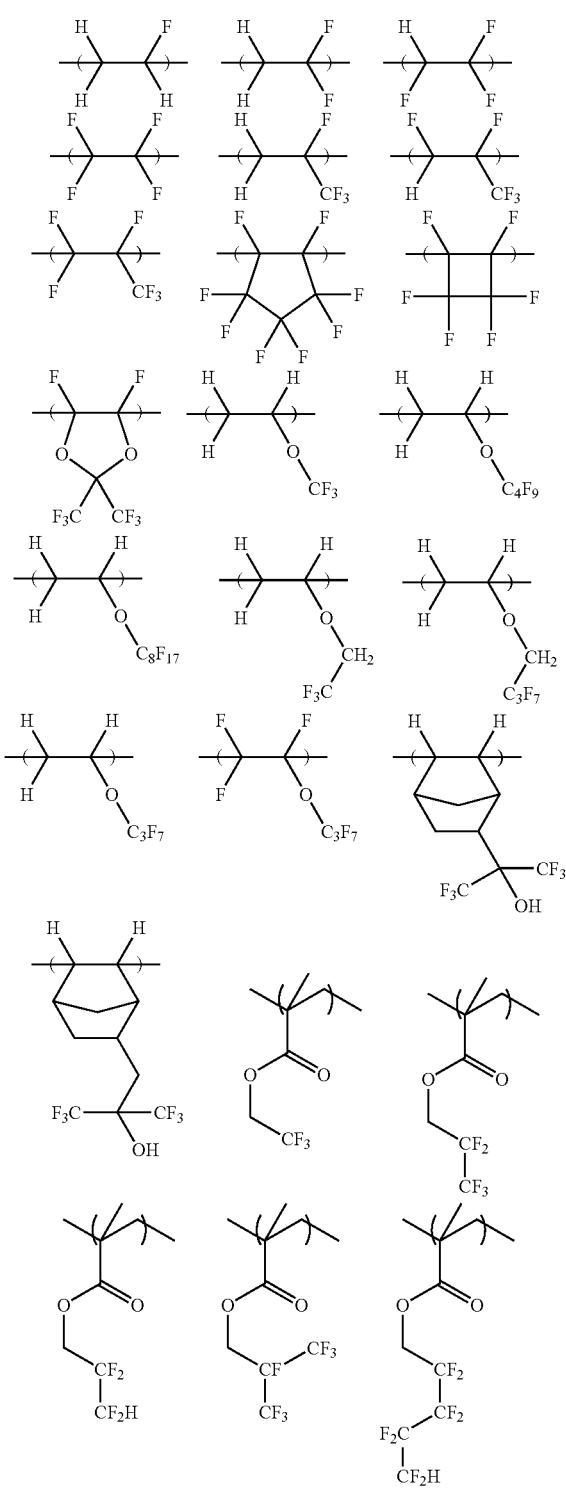

-continued
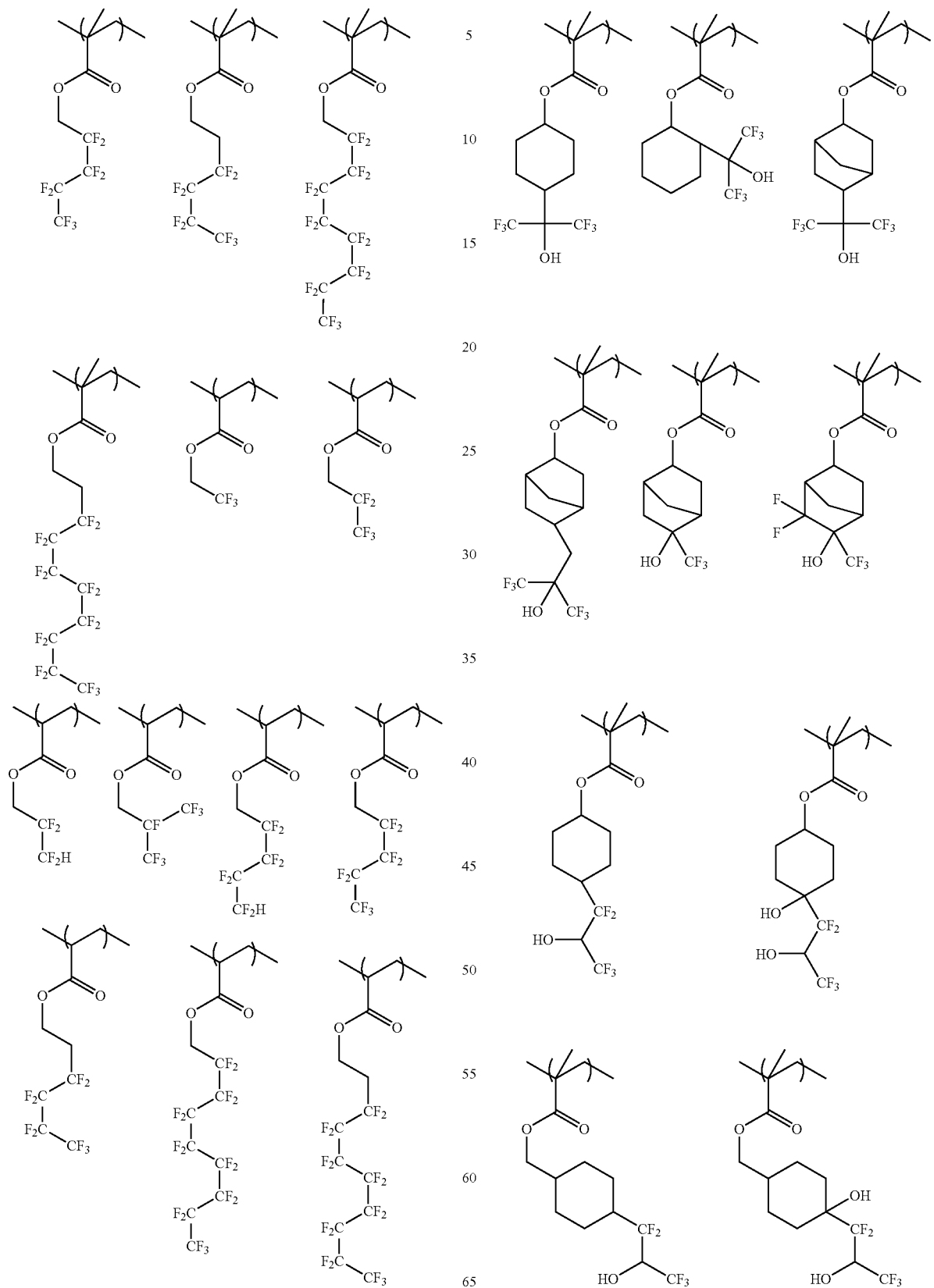

-continued
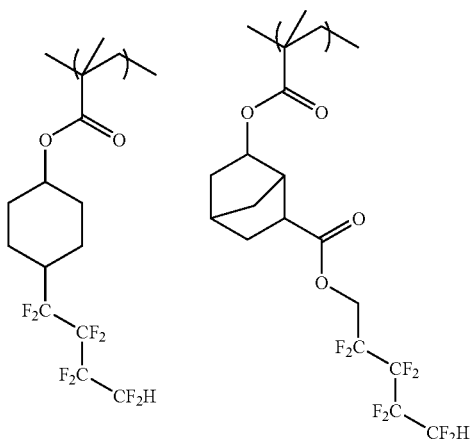
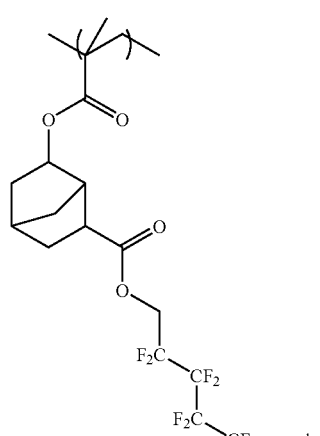
the recurring unit having sulfo group is at least one selected from the group consisting of units having the following formulae:
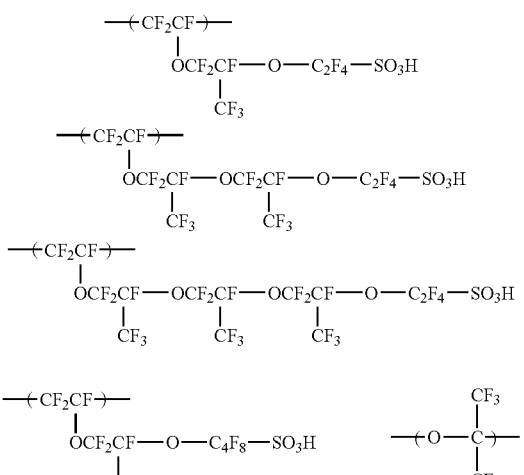
-continued
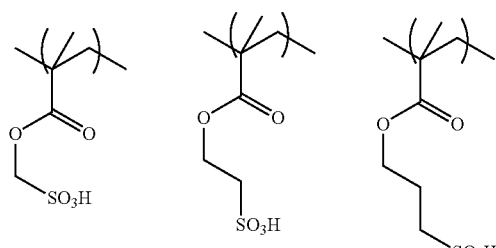
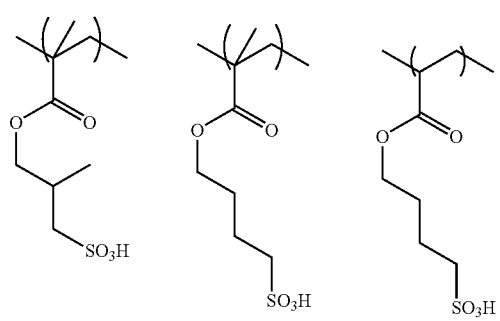
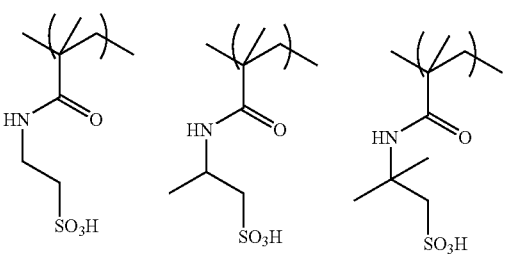
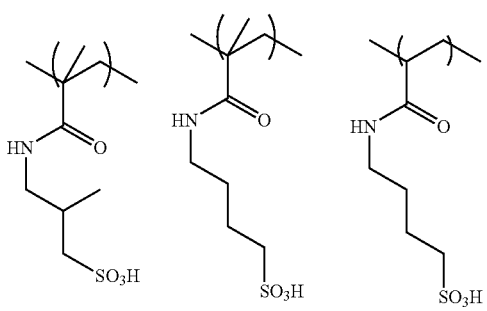
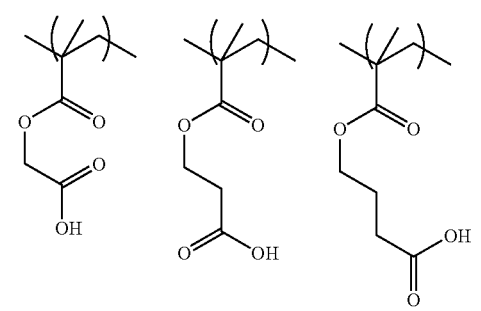

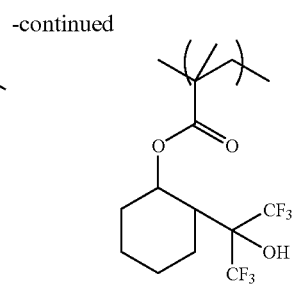

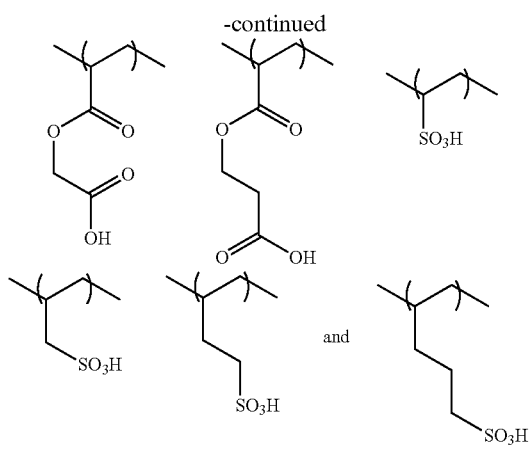

9. A resist overcoat material for use in an immersion lithography process for forming a pattern, comprising the steps of forming a photoresist layer on a wafer, forming a protective coating on the photoresist layer from a resist overcoat material, exposing the layer structure to light in water, and developing, the resist overcoat material comprising a polymer having copolymerized recurring units containing fluorine and recurring units having sulfo or carboxyl groups, wherein said recurring units containing fluorine are recurring units selected from the following general formulae;

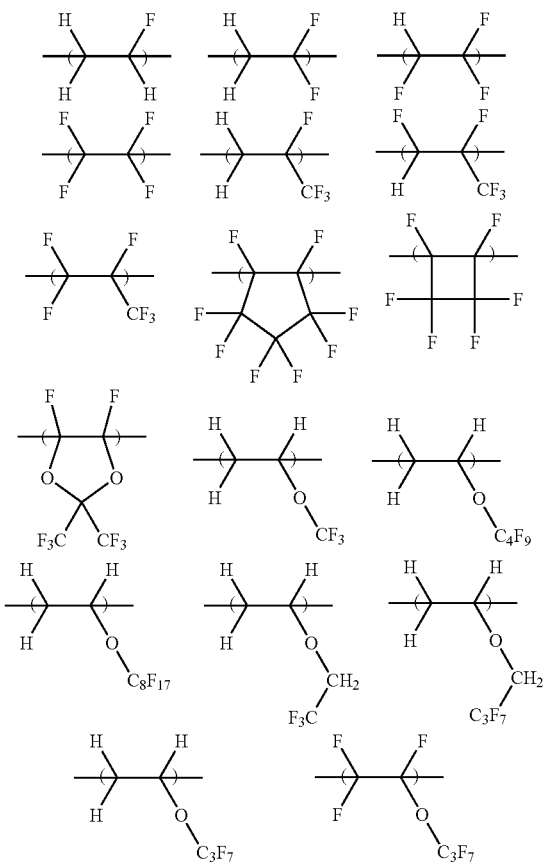

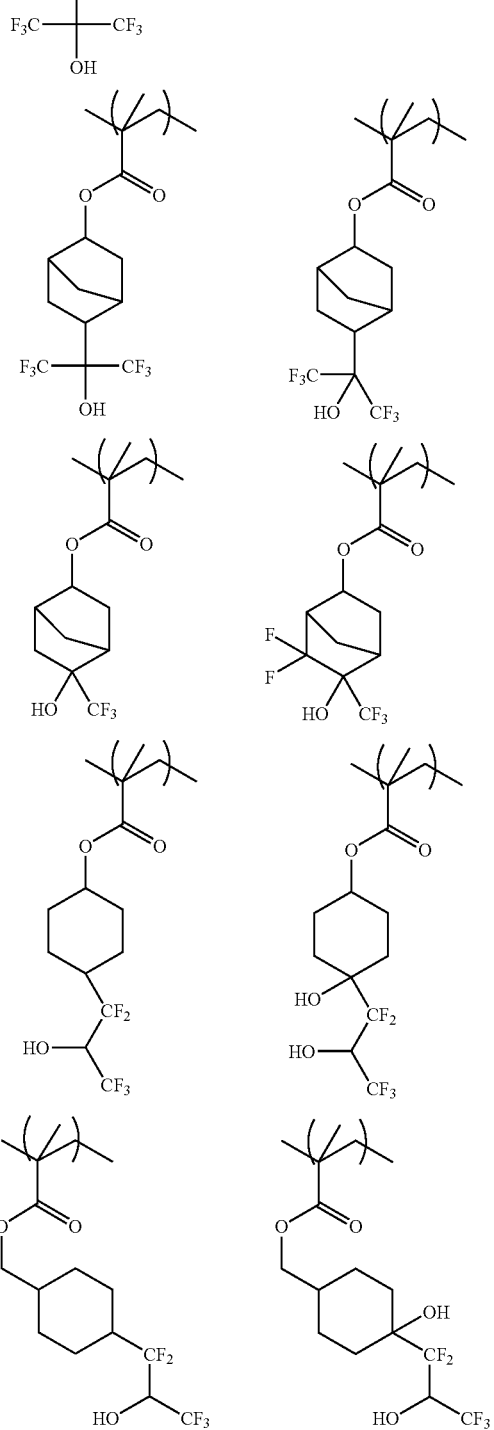

and said recurring units having sulfa or carboxyl groups are recurring units selected from the following general formulae (3) to (7):

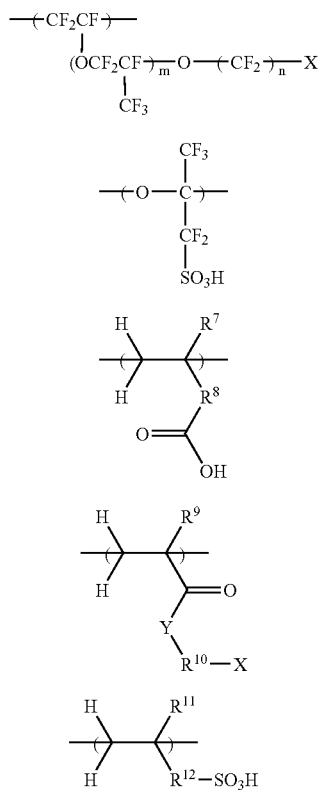

wherein $R^7$ is hydrogen, fluorine, methyl or trifluoromethyl; $R^2$ is a single bond or a straight, branched or cyclic $C_1$-$C_4$ alkylene group which may have an ether group; $R^9$ and $R^{11}$ each are hydrogen or methyl; $R^{10}$ is a $C_1$-$C_{10}$ alkylene group; $R^{12}$ is a single bond or a straight, branched or cyclic $C_1$-$C_4$ ailcylene group; X is a carboxyl or sulfo group; Y is —O— or —NH—; m is an integer of 0 to 10; and n is an integer of 1 to 10.

10. The resist overcoat material of claim 9, further comprising an alkyl alcohol or fluorinated alkyl alcohol.

11. The resist overcoat material of claim 9, wherein the recurring units having sulfo or carboxyl groups is at least one selected from the group consisting of units having the following formulae:

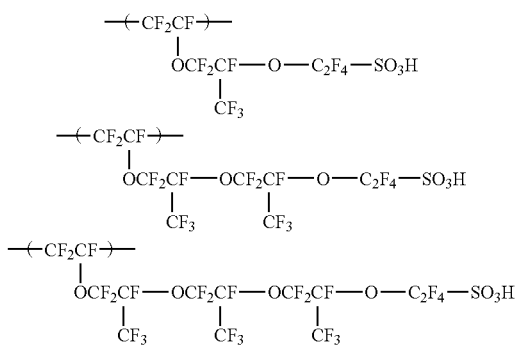

-continued

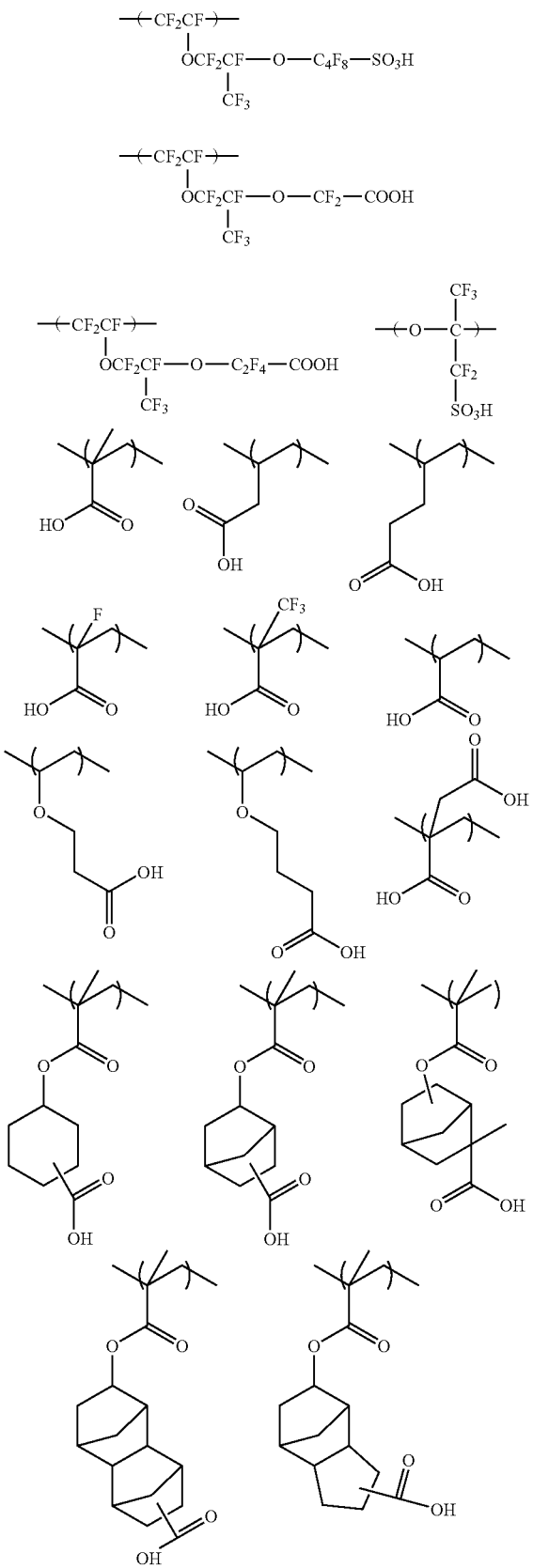

-continued

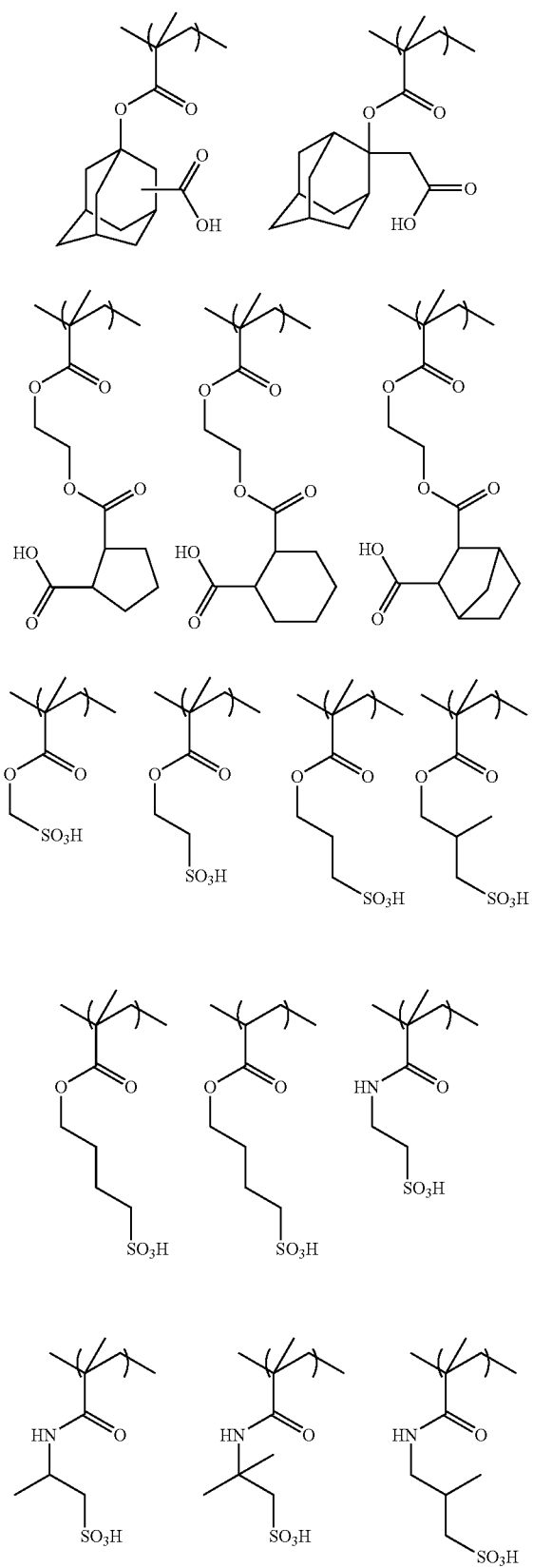

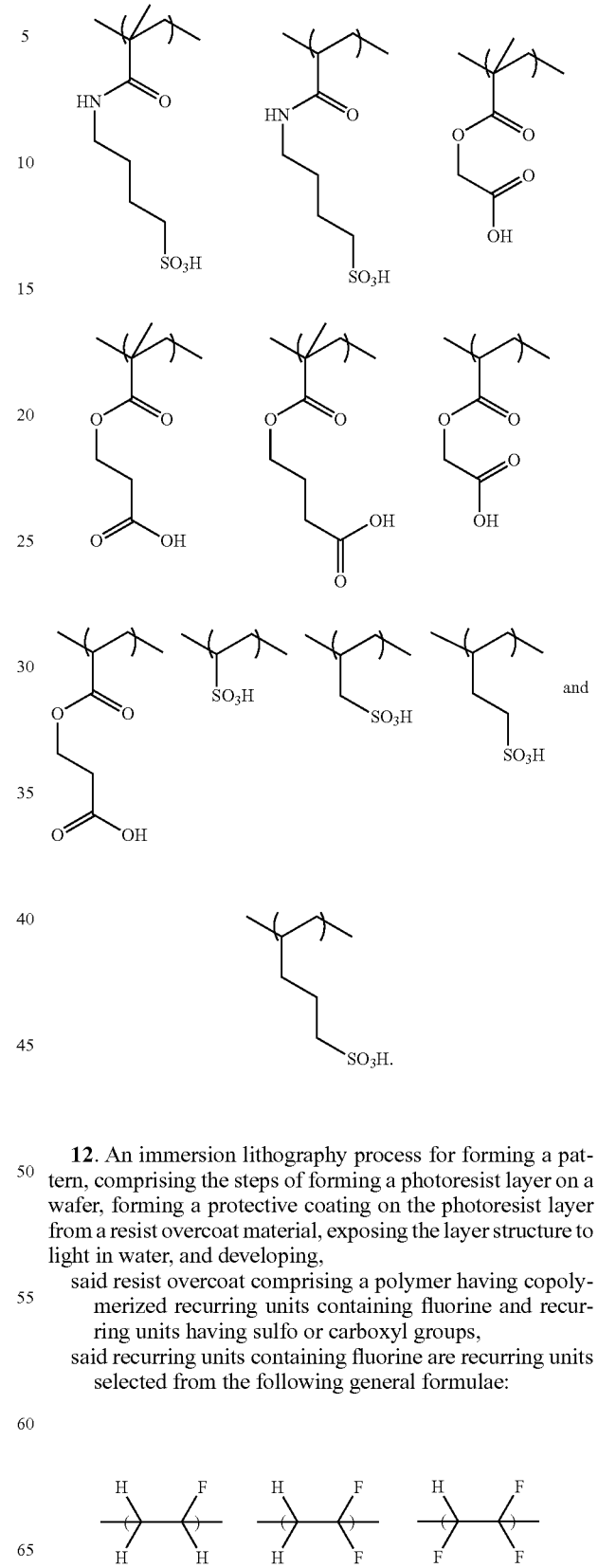

12. An immersion lithography process for forming a pattern, comprising the steps of forming a photoresist layer on a wafer, forming a protective coating on the photoresist layer from a resist overcoat material, exposing the layer structure to light in water, and developing, said resist overcoat comprising a polymer having copolymerized recurring units containing fluorine and recurring units having sulfo or carboxyl groups, said recurring units containing fluorine are recurring units selected from the following general formulae:

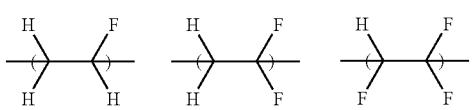

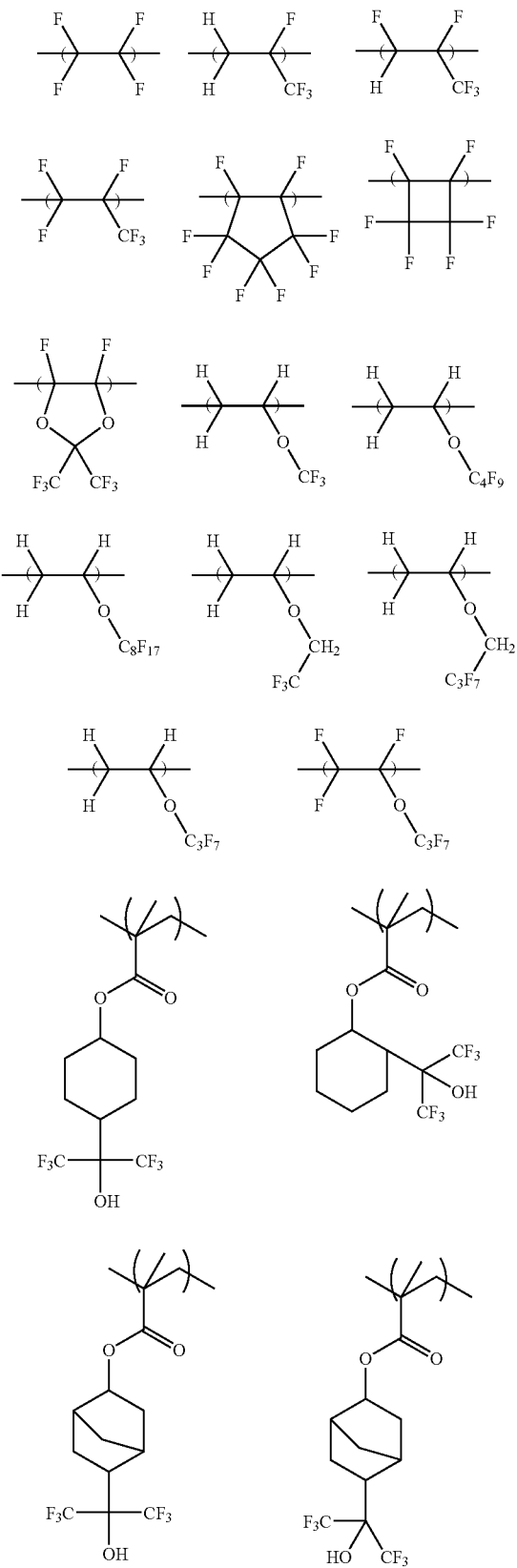
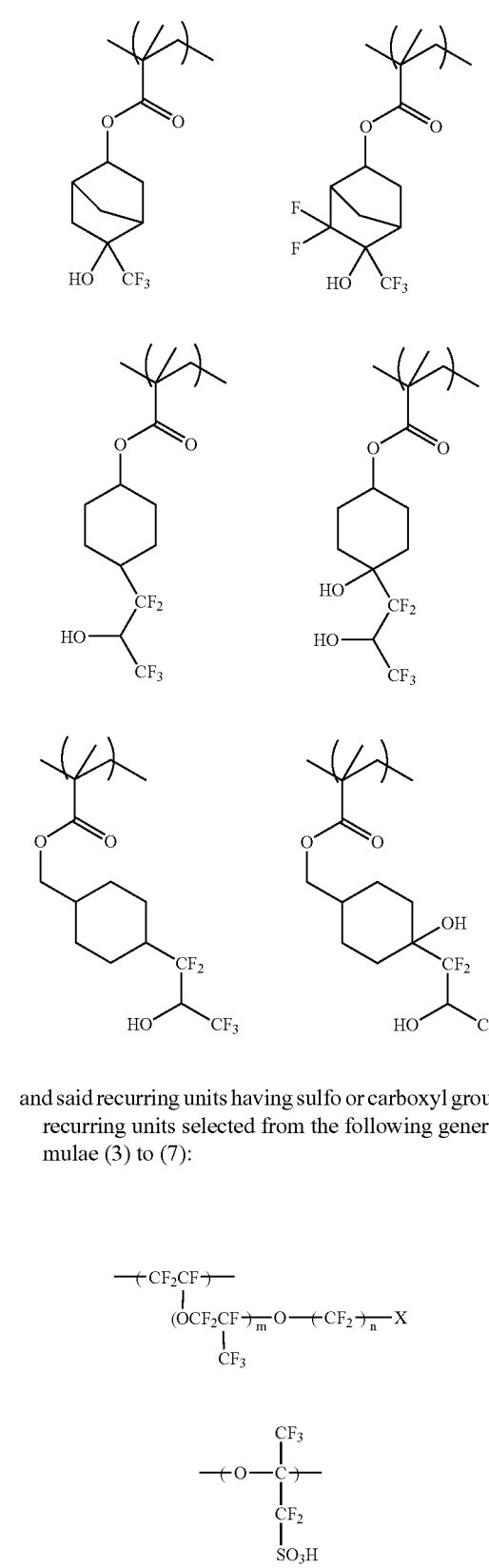
and said recurring units having sulfo or carboxyl groups are recurring units selected from the following general formulae (3) to (7):
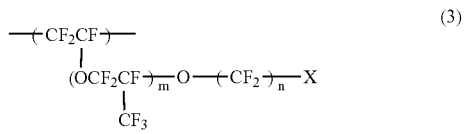
(3)
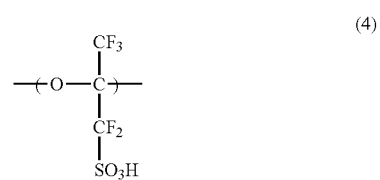
(4)

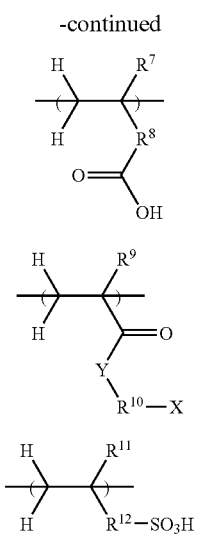

wherein $R^7$ is hydrogen, fluorine, methyl or trifluoromethyl; $R^8$ is a single bond or a straight, branched or cyclic $C_1$-$C_4$ alkylene group which may have an ether group; $R^9$ and $R^{11}$ each are hydrogen or methyl; $R^{10}$ is a $C_1$-$C_{10}$ alkylene group; $R^{12}$ is a single bond or a straight, branched or cyclic $C_1$-$C_4$ alkylene group; X is a carboxyl or sulfo group; Y is —O— or —NH—; m is an integer of 0 to 10; and n is an integer of 1 to 10.

13. The pattern forming process of claim 12, wherein the exposing step includes directing radiation having a wavelength in the range of 180 to 250 nm from a projection lens toward the wafer, with water intervening between the projection lens and the wafer.

14. The pattern forming process of claim 12, wherein the developing step includes developing the photoresist layer and stripping the protective coating of resist overcoat material at the same time, using an alkaline developer.

15. The pattern forming process of claim 12, wherein resist overcoat material further comprises as a solvent which does not dissolve the photoresist layer an alkyl alcohol or fluorinated alkyl alcohol.

16. The immersion lithography process of claim 12, wherein the recurring units having sulfo or carboxyl groups is at least one selected from the group consisting of units having the following formulae: